(12) United States Patent
Matsumoto et al.

(10) Patent No.: US 7,067,881 B2
(45) Date of Patent: Jun. 27, 2006

(54) SEMICONDUCTOR DEVICE

(75) Inventors: Takuji Matsumoto, Kanagawa (JP); Takashi Ipposhi, Tokyo (JP); Toshiaki Iwamatsu, Tokyo (JP); Yuuichi Hirano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 38 days.

(21) Appl. No.: 10/754,539

(22) Filed: Jan. 12, 2004

(65) Prior Publication Data

US 2004/0227185 A1    Nov. 18, 2004

(30) Foreign Application Priority Data

Jan. 15, 2003  (JP) ............................ 2003-006641
Aug. 19, 2003  (JP) ............................ 2003-295234

(51) Int. Cl.
*H01L 27/01* (2006.01)

(52) U.S. Cl. ............... 257/347; 257/349; 257/350; 257/351; 257/374; 257/466; 257/618

(58) Field of Classification Search .................. None
See application file for complete search history.

(56) References Cited

U.S. PATENT DOCUMENTS

| 5,889,331 A  * | 3/1999  | Bai ............................. 257/768 |
| 6,314,021 B1 * | 11/2001 | Maeda et al. .......... 365/185.01 |
| 6,512,258 B1 * | 1/2003  | Maeda ........................ 257/303 |
| 6,518,155 B1 * | 2/2003  | Chau et al. ................. 438/592 |
| 6,765,273 B1 * | 7/2004  | Chau et al. ................. 257/412 |
| 6,777,283 B1 * | 8/2004  | Maeda ........................ 438/231 |
| 6,777,759 B1 * | 8/2004  | Chau et al. ................. 257/377 |
| 2002/0053711 A1 | 5/2002 | Chau et al. |

FOREIGN PATENT DOCUMENTS

JP         10-209167        8/1998

OTHER PUBLICATIONS

Y. Hirano, et al., IEEE International SOI Conference, pp. 131-132, "Bulk-Layout-Compatible 0.18μm SOI-CMOS Technology Using Body-Fixed Partial Trench Isolation (PTI)", Oct. 1999.
S. Maeda, et al., Symposium on VLSI Technology Digest of Technical Papers, pp. 154-155, "Impact of 0.18μm SOI CMOS Technology Using Hybrid Trench Isolation with High Resistivity Substrate on Embedded RF/Analog Applications". 2000.

(Continued)

*Primary Examiner*—Andy Huynh
(74) *Attorney, Agent, or Firm*—Oblon, Spivak, McClelland, Maier & Neustadt, P.C.

(57) ABSTRACT

A semiconductor device and its manufacturing method are provided which can properly avoid reduction of isolation breakdown voltage without involving adverse effects like an increase in junction capacitance. Impurity-introduced regions (11) are formed after a silicon layer (3) has been thinned through formation of recesses (14). Therefore n-type impurities are not implanted into the portions of the p-type silicon layer (3) that are located between the bottoms of element isolation insulating films (5) and the top surface of a BOX layer (2), which avoids reduction of isolation breakdown voltage. Furthermore, since the impurity-introduced regions (11) are formed to reach the upper surface of the BOX layer (2), the junction capacitance of source/drain regions (12) is not increased.

6 Claims, 42 Drawing Sheets

OTHER PUBLICATIONS

Y. Hirano, et al., IEEE, IEDM, pp. 467-470, "Impact of 0.10 μm SOI CMOS With Body-Tied Hybrid Trench Isolation Structure to Break Through the Scaling Crisis of Silicon Technology", 2000.

S. Maeda, et al., Extended Abstracts of the 2001 International Conference on Solid State Devices and Materials, pp. 270-271, "A Highly Reliable 0.18 μm SOI CMOS Technology for 3.3V/1.8V Operation Using Hybrid Trench Isolation and Dual Gate Oxide", 2001.

* cited by examiner

F I G . 6
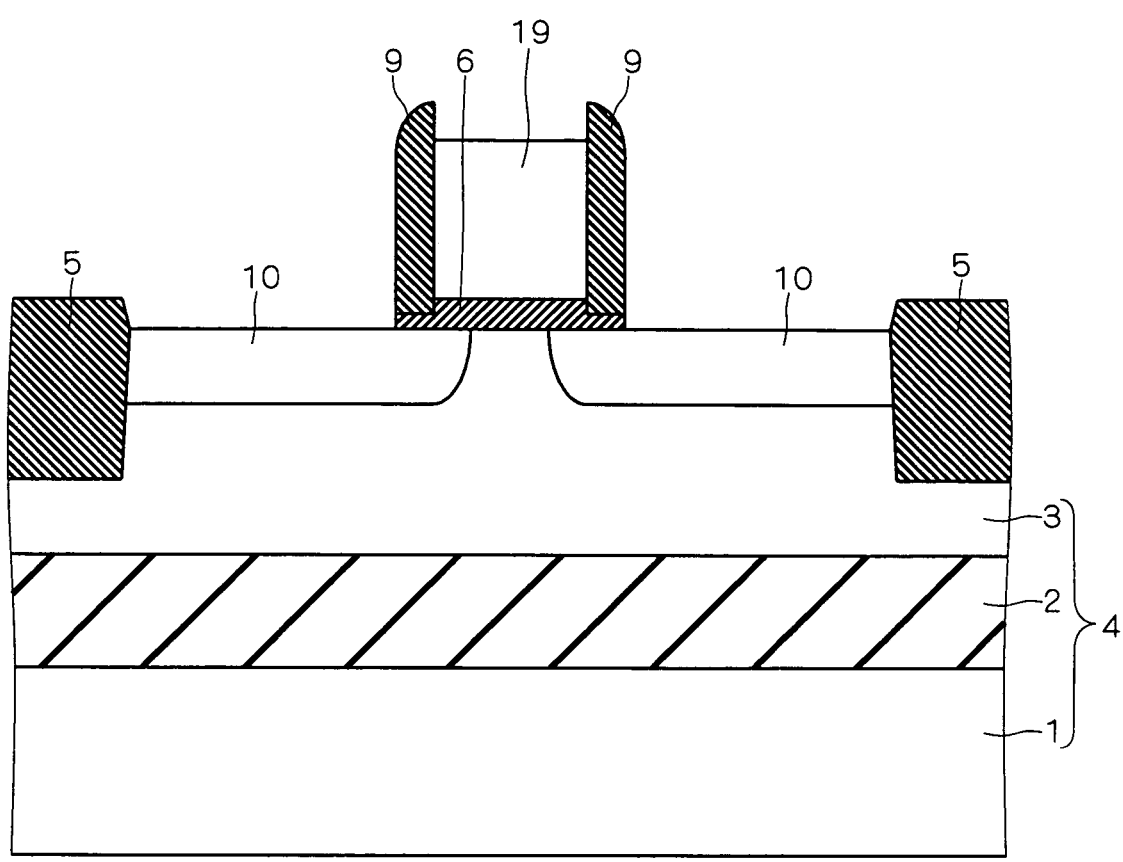

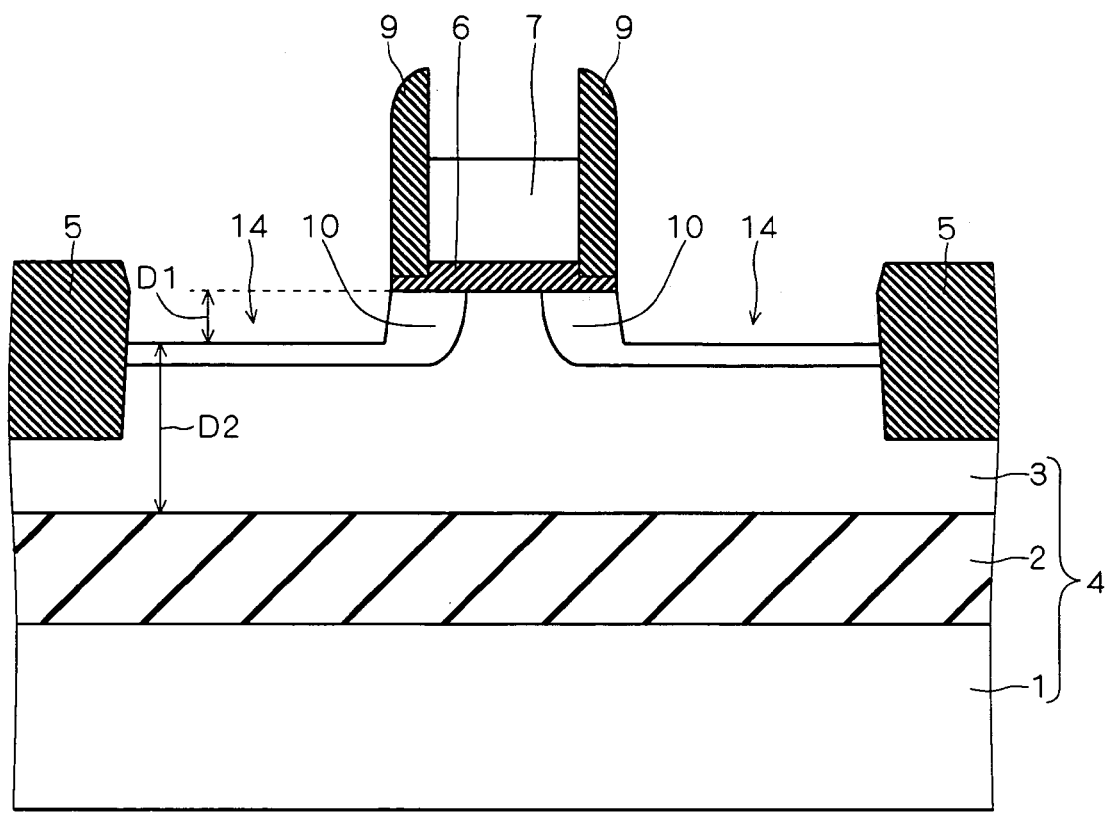
F I G . 7

F I G . 9
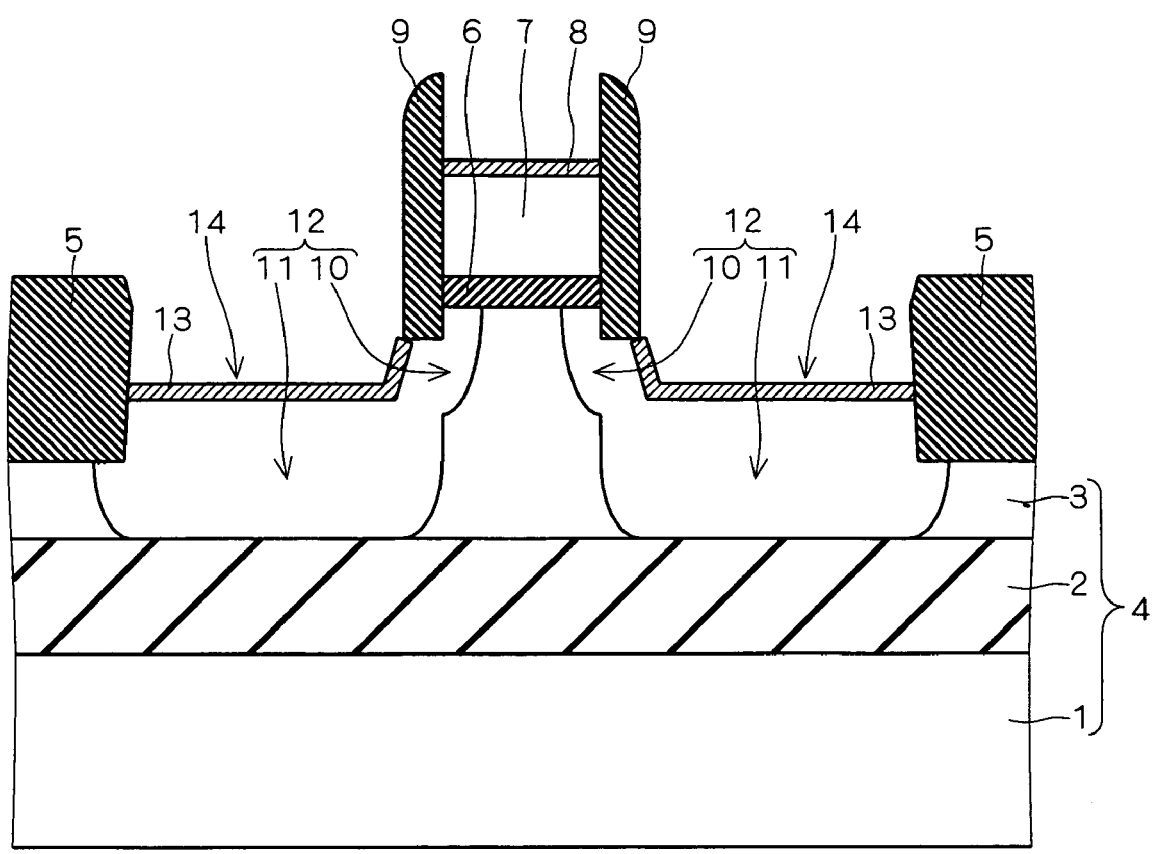

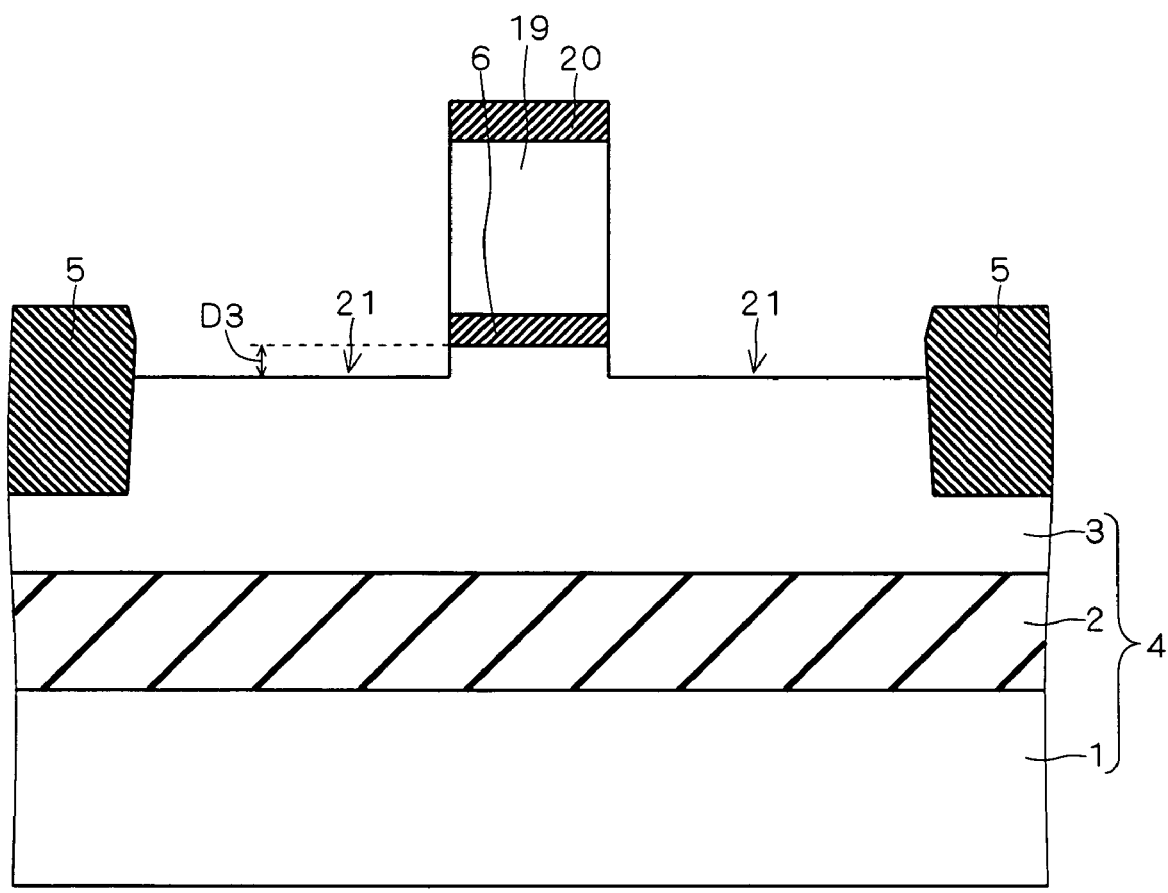
F I G . 1 0

F I G . 1 3
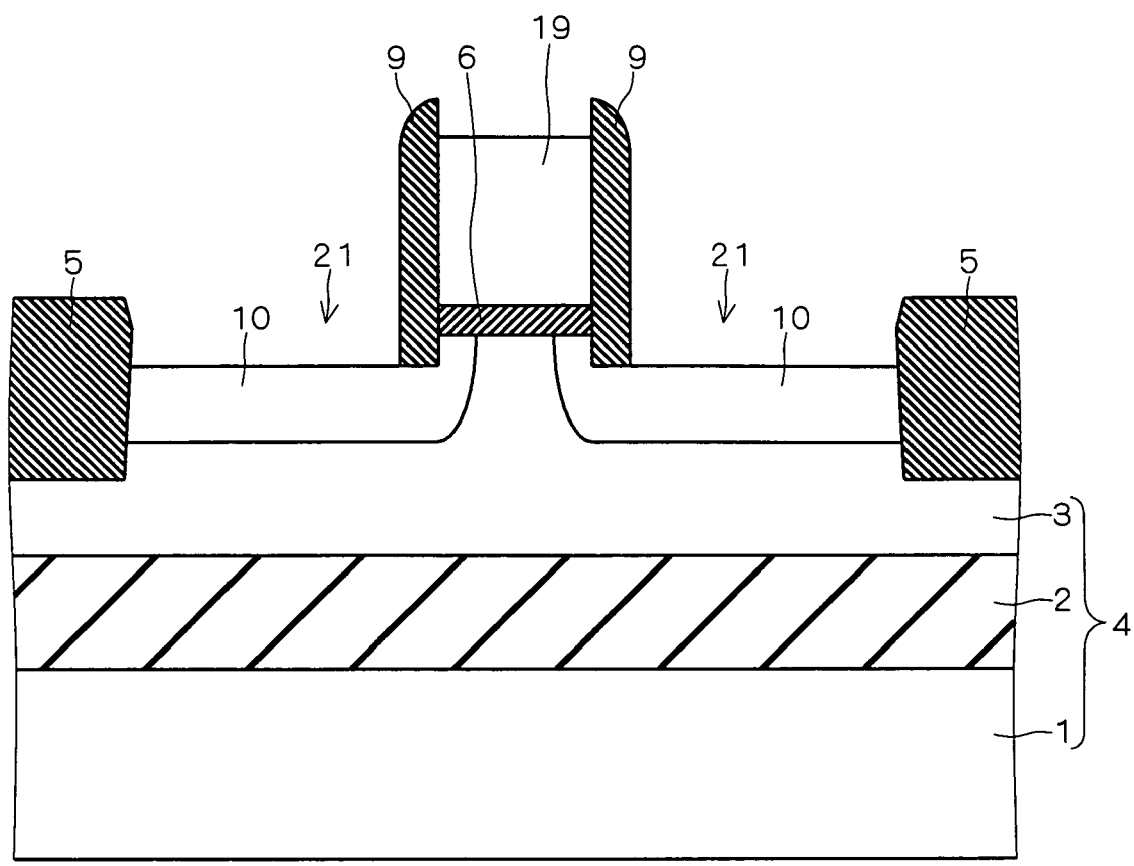

F I G . 1 6
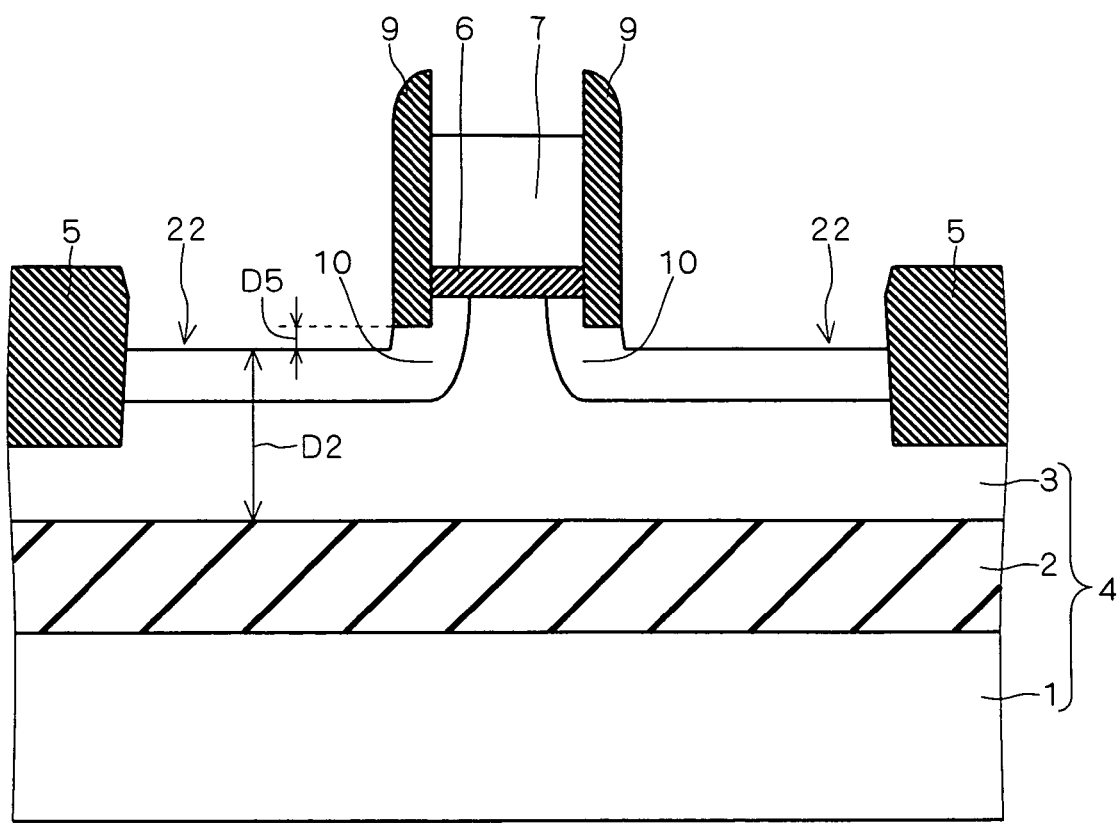

F I G . 3 3
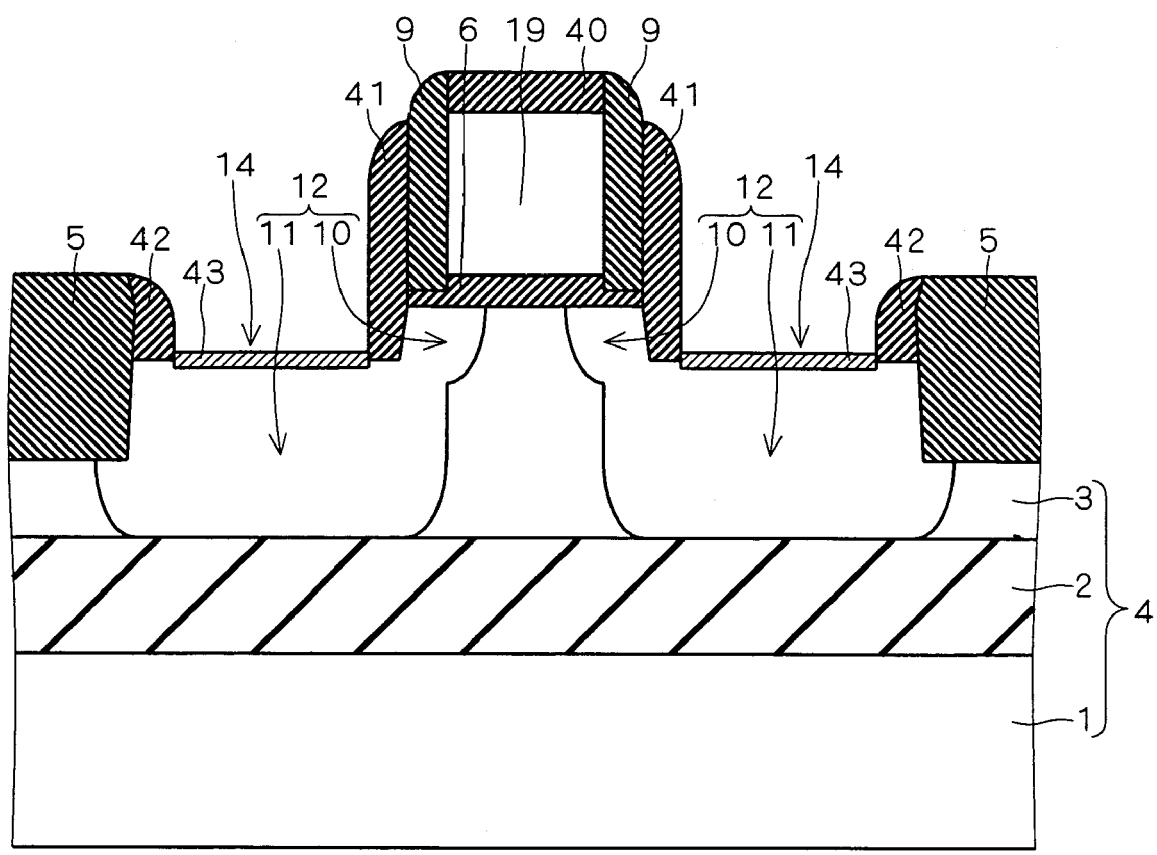

F I G . 3 9
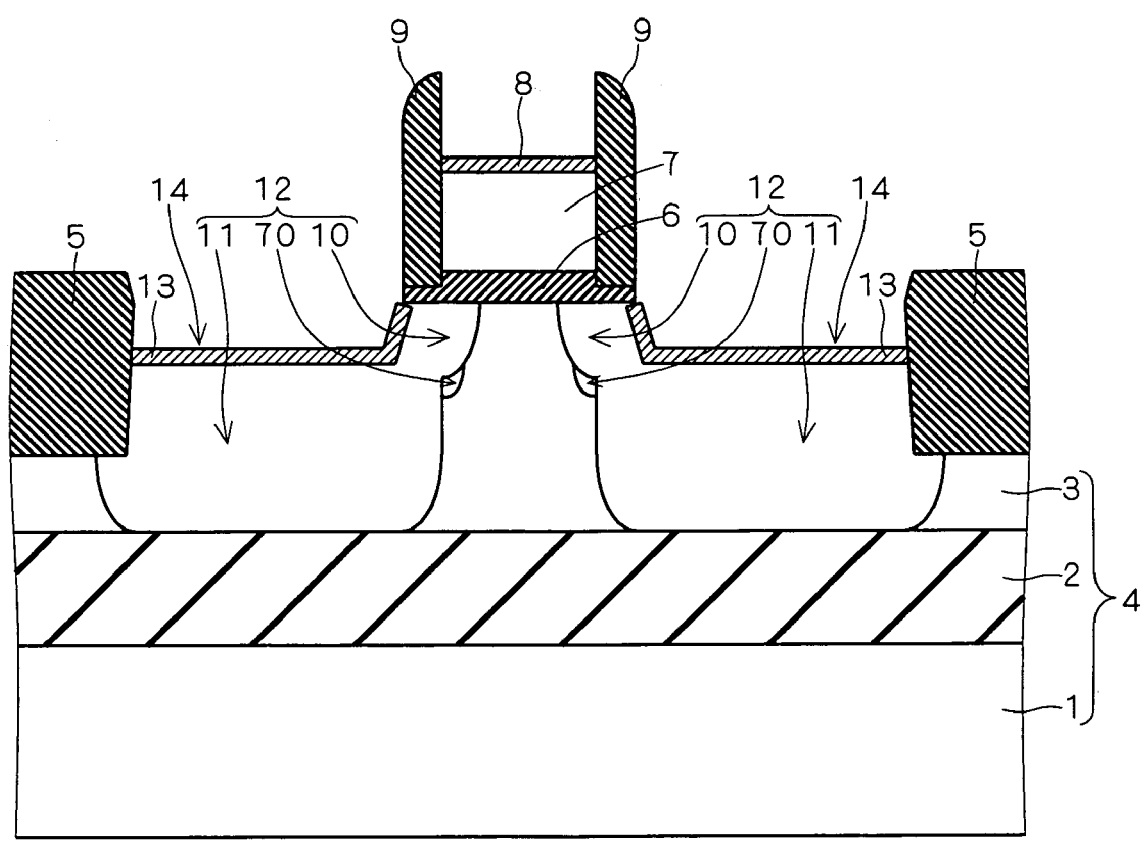

F I G . 4 0
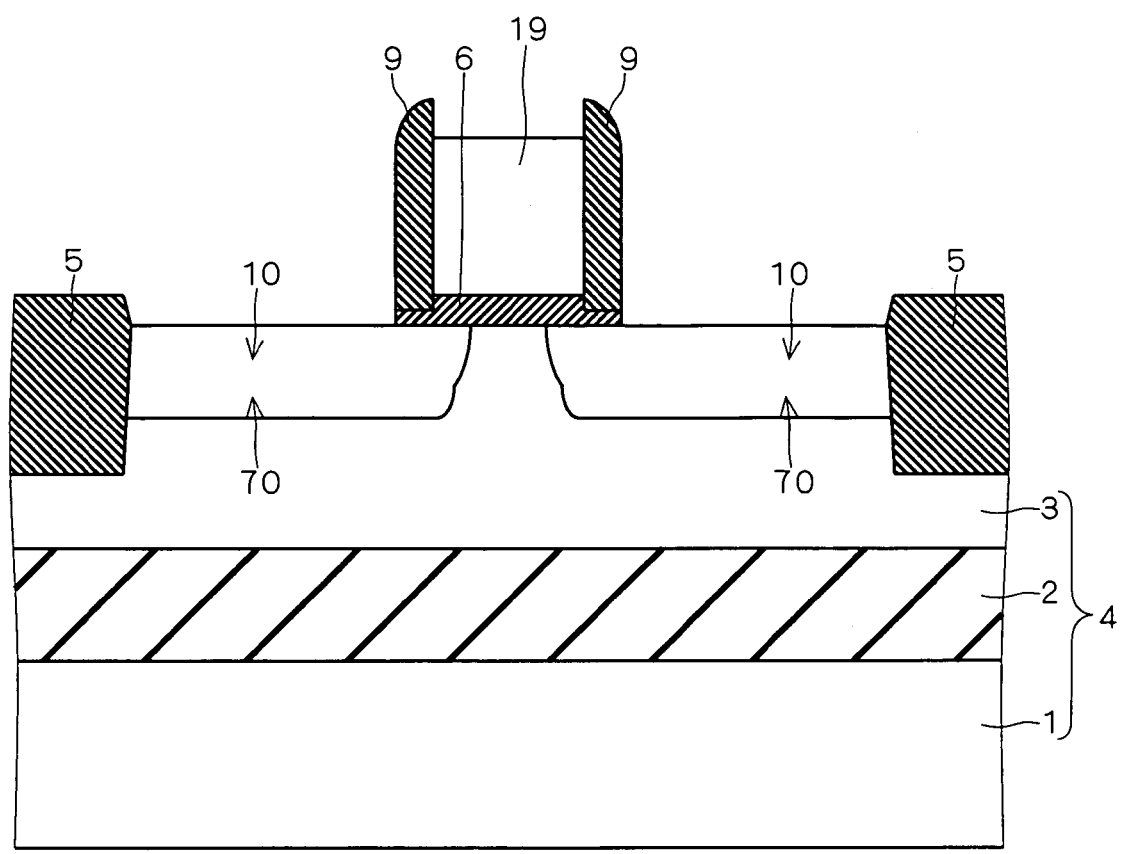

F I G . 4 4
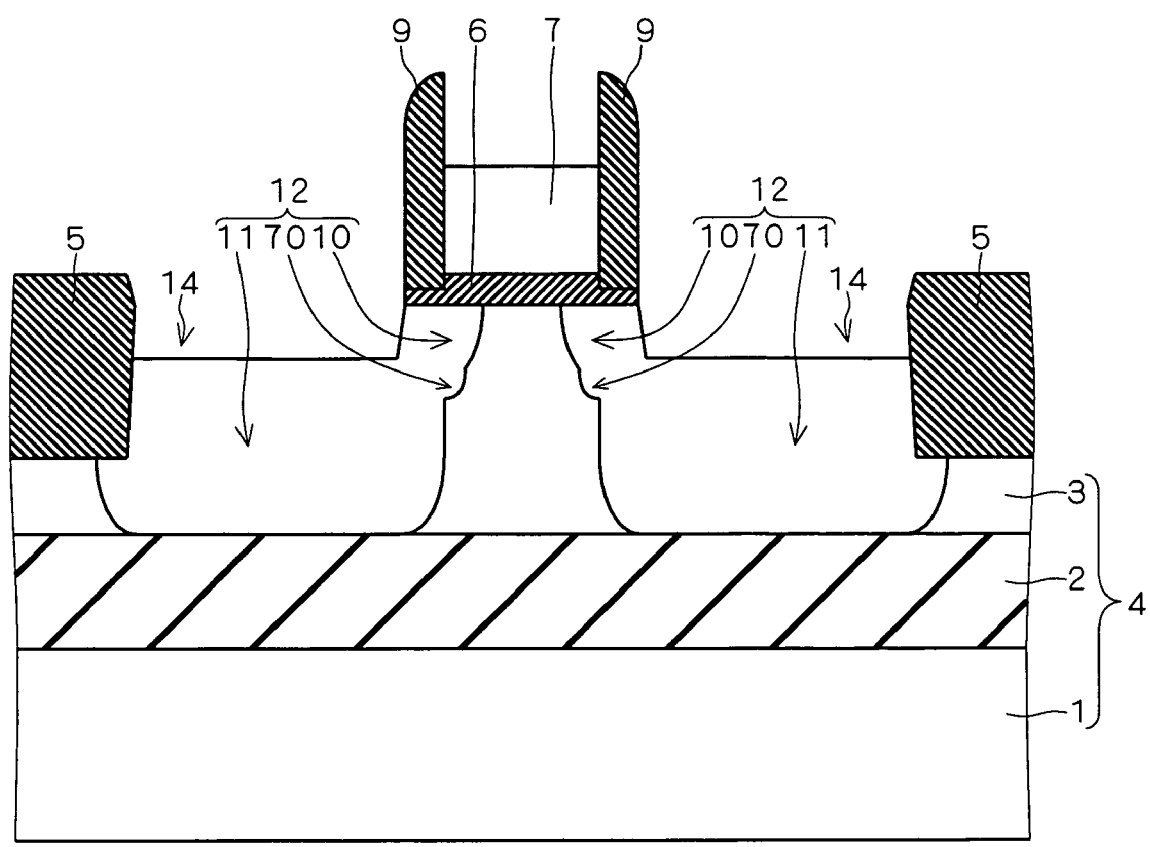

F I G. 5 7
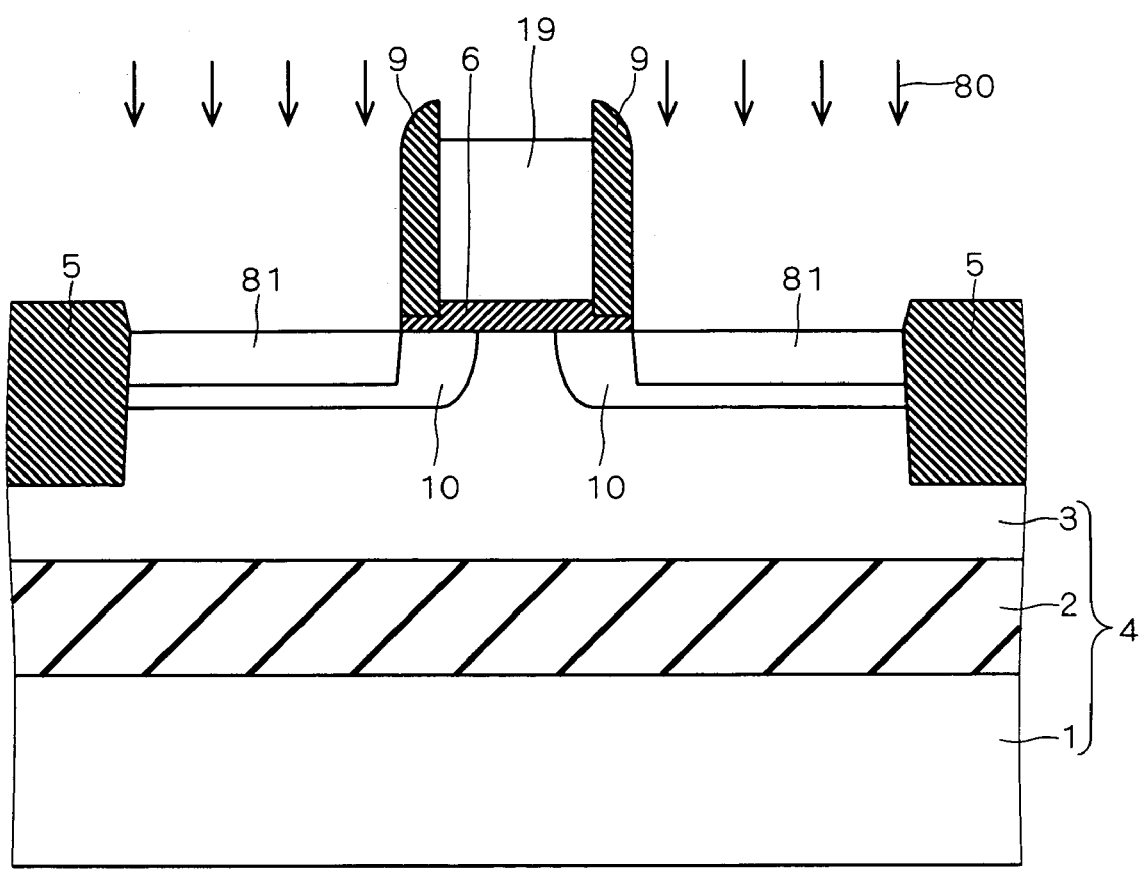

SEMICONDUCTOR DEVICE

BACKGROUND OF THE INVENTION

1. Field of the Invention

The present invention relates to a semiconductor device using an SOI substrate and its manufacturing method.

2. Description of the Background Art

An SOI substrate has a semiconductor substrate, an insulating layer, and a semiconductor layer of a first conductivity type which are stacked in this order. A method for manufacturing a conventional semiconductor device using an SOI substrate includes the steps of: (a) forming an element-isolation insulating film of a so-called partial isolation type in portions in an upper surface of a semiconductor layer; (b) in an element formation region, forming a gate structure on a portion of the upper surface of the semiconductor layer; and (c) ion-implanting impurities into the upper surface of the semiconductor layer to form source/drain regions of a second conductivity type that extend from the upper surface of the semiconductor layer to reach the insulating layer. The steps (a) to (c) are performed in this order.

A technique about a semiconductor device using an SOI substrate and a method for manufacturing the same are disclosed in Japanese Patent Application Laid-Open No. 10-209167 (1998).

In the conventional semiconductor device manufacturing method, when the ion implant energy is increased to cause the source/drain regions to reach the insulating layer, then the second conductivity type impurities are implanted into the portions of the semiconductor layer that are located between the bottom surface of the element-isolation insulating film and the top surface of the insulating layer. Then the first conductivity type concentration in those portions is lowered, which lowers the isolation breakdown voltage.

When, in order to solve this problem, the ion implant energy is lowered so that impurities will not penetrate through the element-isolation insulating film, the source/drain regions will not reach the insulating layer and the junction capacitance of the source/drain regions will increase. This causes problems, such as reduced operating speed and increased power consumption.

Also, in order to solve the problem, when the element-isolation insulating film is formed deep so that its bottom surface is located close to the top surface of the insulating layer, then the resistance value of the semiconductor layer will increase in the portions located between the bottom surface of the element-isolation insulating film and the top surface of the insulating layer.

Also, in order to solve the problem, when the element-isolation insulating film is formed thick so that its top surface is located extremely higher than the top surface of the semiconductor layer, then the large difference in height between the top surface of the element-isolation insulating film and the top surface of the semiconductor layer makes it difficult to accurately form the gate electrode. This will cause problems, such as reduction of operating speed and variation of characteristics.

SUMMARY OF THE INVENTION

An object of the present invention is to provide a semiconductor device which can appropriately avoid reduction of isolation breakdown voltage without causing adverse effects such as an increase in junction capacitance.

According to the present invention, a semiconductor device includes an SOI substrate, element isolation insulating films, a gate structure, a pair of recesses, and source/drain regions. The SOI substrate has a semiconductor substrate, an insulating layer, and a semiconductor layer of a first conductivity type that are stacked in this order. The element isolation insulating films are formed partially in a main surface of the semiconductor layer, with portions of the semiconductor layer interposed between the insulating layer and bottom surfaces of the element isolation insulating films. The gate structure is formed partially on the main surface of the semiconductor layer in an element formation region defined by the element isolation insulating films. The pair of recesses are formed in the element formation region, in the main surface of the semiconductor layer in portions that are not covered by the gate structure, with a channel formation region under the gate structure interposed between the pair of recesses. The source/drain regions are formed in bottom surfaces of the recesses and have a second conductivity type that is different from the first conductivity type, and the source/drain regions form a pair, with the channel formation region interposed therebetween, and have bottom surfaces or depletion layers that reach the insulating layer.

The semiconductor layer is thinned through formation of the recesses and then the source/drain regions are formed. Therefore impurities of the second conductivity type are not implanted into the portions of the first-conductivity-type semiconductor layer that are located between the bottom surfaces of the element isolation insulating films and the top surface of the insulating layer, which avoids reduction of isolation breakdown voltage. Furthermore, since the source/drain regions are formed to reach the insulating layer, the junction capacitance of the source/drain regions is not increased.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 8 are cross-sectional views showing a sequence of process steps for manufacturing the semiconductor device of the first preferred embodiment of the present invention;

FIG. 9 is a cross-sectional view showing the structure of a semiconductor device according to a second preferred embodiment of the present invention;

FIGS. 10 to 15 are cross-sectional views showing a sequence of process steps for manufacturing the semiconductor device of the second preferred embodiment of the present invention;

FIG. 16 is a cross-sectional view showing a process step for manufacturing a semiconductor device according to a modification of the second preferred embodiment of the present invention;

FIGS. 32 and 33 are cross-sectional views showing a sequence of process steps for manufacturing a semiconductor device of a seventh preferred embodiment of the present invention;

FIGS. 39 is a cross-sectional view showing the structure of a semiconductor device according to a tenth preferred embodiment of the present invention;

FIGS. 40 and 41 are cross-sectional views showing a first sequence of process steps for manufacturing the semiconductor device of the tenth preferred embodiment of the present invention;

FIGS. 43 and 44 are cross-sectional views showing a second sequence of process steps for manufacturing the semiconductor device of the tenth preferred embodiment of the present invention;

FIG. 57 is a cross-sectional view showing a process step for manufacturing a semiconductor device according to a twelfth preferred embodiment of the present invention.

DESCRIPTION OF THE PREFERRED EMBODIMENTS

First Preferred Embodiment.

Figure 1:
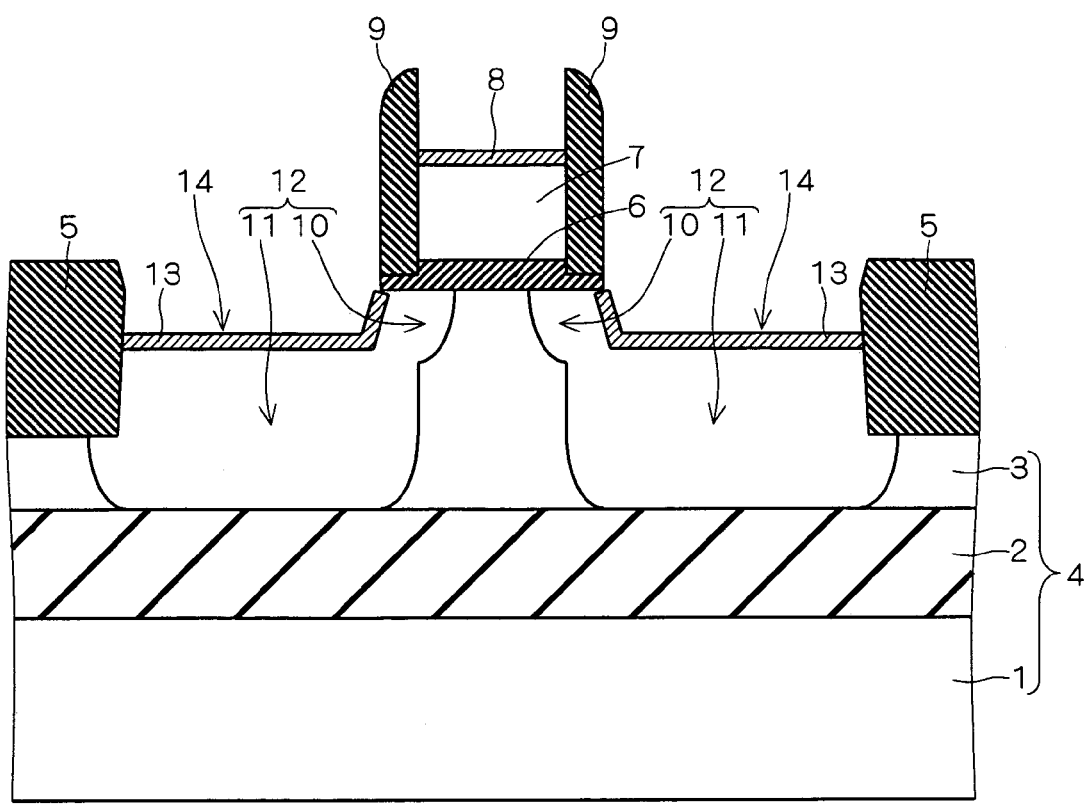
FIG. 1 is a cross-sectional view showing the structure of a semiconductor device according to a first preferred embodiment of the present invention.

FIG. 1 is a cross-sectional view showing the structure of a semiconductor device according to a first preferred embodiment of the present invention. An SOI substrate 4 has a silicon substrate 1, a BOX (buried oxide) layer 2, and a p-type silicon layer 3 which are stacked in this order. Element isolation insulating films 5 of a so-called partial isolation type are formed in portions in the upper surface of the silicon layer 3. The element isolation insulating film 5 is made of silicon oxide, for example. Portions of the silicon layer 3 are interposed between the bottom surfaces of the element isolation insulating films 5 and the top surface of the BOX layer 2.

In the element formation region defined by the element isolation insulating films 5, a gate structure is formed on a part of the top surface of the silicon layer 3. The gate structure includes a gate insulating film 6 of silicon oxide formed on the top surface of the silicon layer 3, a gate electrode 7 of polysilicon formed on the gate insulating film 6, sidewalls 9 of silicon nitride film formed on the side surfaces of the gate electrode 7, and a cobalt silicide layer 8 formed on the top surface of the gate electrode 7. The portion of the silicon layer 3 that is located under the gate structure is defined as a channel formation region. The materials of the individual parts are not limited to those shown above. The gate insulating film 6 may be composed of a silicon oxynitride film or high-dielectric-constant film. The gate electrode 7 may be composed of metal, such as tungsten, aluminum, or tantalum. The sidewalls 9 may be composed of a composite film of silicon oxide and silicon nitride films. The cobalt silicide layer 8 may be replaced by a nickel silicide layer or a titanium silicide layer, for example.

In the element formation region, a pair of recesses 14 are formed in the top surface of the silicon layer 3 in the portions not covered by the gate structure, with the channel formation region interposed between them. Also, a pair of n-type source/drain regions 12 are formed in the silicon layer 3, with the channel formation region interposed between them. The source/drain regions 12 include impurity-introduced regions 10 (which are referred to also as extensions) having a relatively low concentration and formed shallow in the top surface of the silicon layer 3 and impurity-introduced regions 11 having a relatively high concentration and formed deeper than the impurity-introduced regions 10. The impurity-introduced regions 11 extend from the bottom surfaces of the recesses 14 to reach the top surface of the BOX layer 2. Cobalt silicide layers 13 are formed on the top surfaces of the source/drain regions 12 in the portions not covered by the gate structure.

FIG. 1 shows a structure in which the bottom surfaces of the impurity-introduced regions 11 are in contact with the top surface of the BOX layer 2. However, instead of this structure, the device may be structured so that the depletion layers formed at the interface between the impurity-introduced regions 11 and the silicon layer 3 reach the top surface of the BOX layer 2. However, from the aspect of junction capacitance reduction, the structure in which the bottom surfaces of the impurity-introduced regions 11 are in contact with the top surface of the BOX layer 2 is more desired, so that this specification describes devices adopting this structure.

Figure 2:
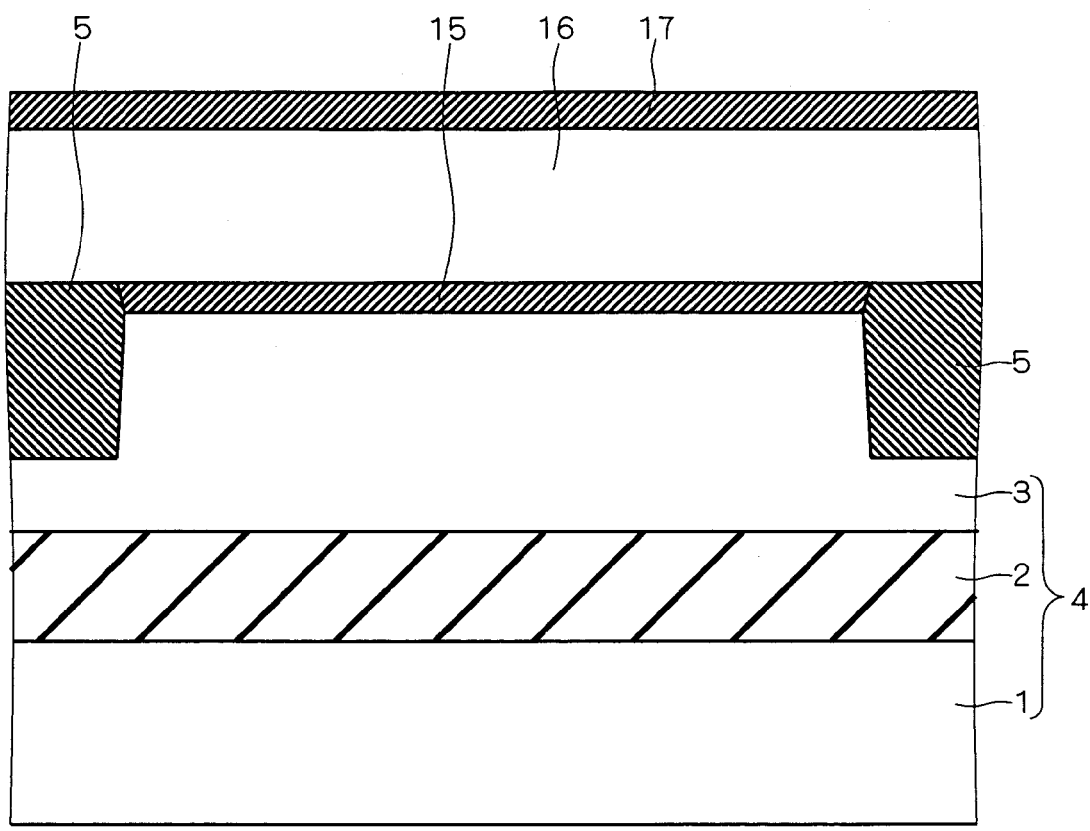

FIGS. 2 to 8 are cross-sectional views showing a sequence of process steps for manufacturing the semiconductor device of the first preferred embodiment. Referring to FIG. 2, the element isolation insulating films 5 are partially formed in the top surface of the silicon layer 3 by a known LOCOS isolation technique or trench isolation technique. Next, a silicon oxide film 15 is formed on the top surface of the silicon layer 3 by thermal oxidation. Next, by CVD, a polysilicon film 16 and a silicon oxide film 17 are formed in this order over the entire surface.

Figure 3:
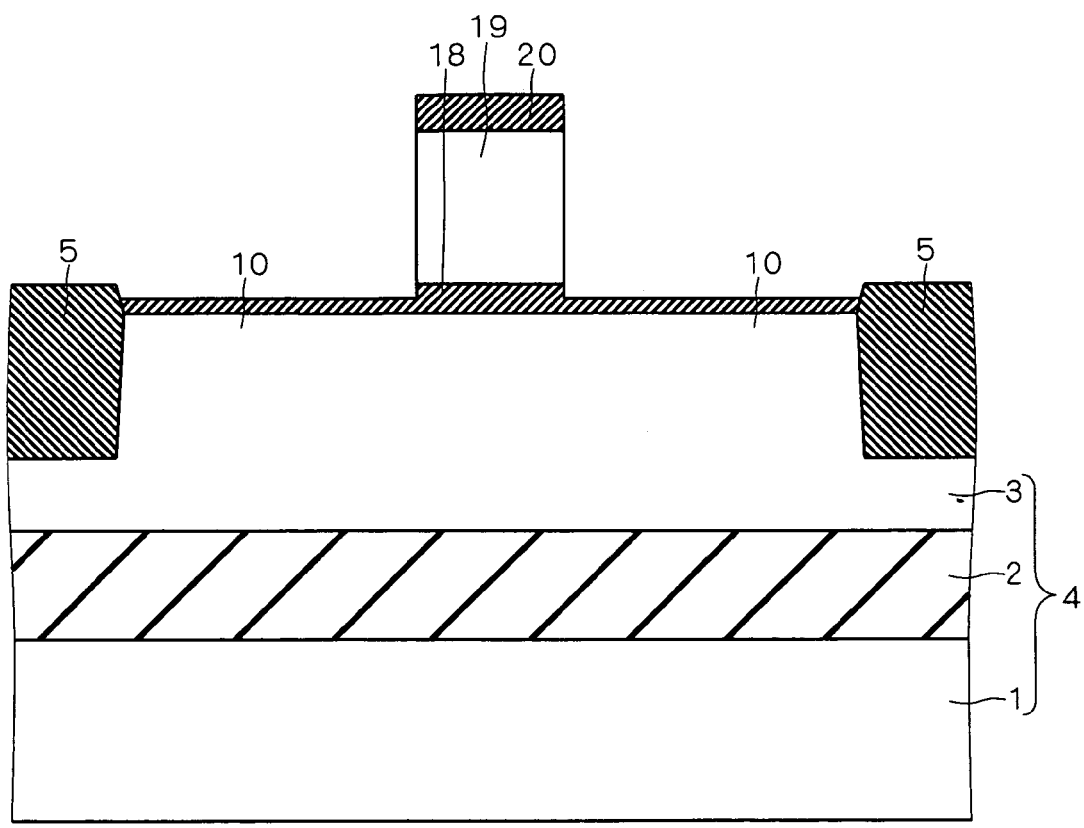

Next, referring to FIG. 3, the polysilicon film 16 and the silicon oxide film 17 are patterned by photolithography and anisotropic dry-etching. A polysilicon film 19 and a silicon oxide film 20 are thus formed. Also, the silicon oxide film 15 is partially etched, forming a silicon oxide film 18.

Figure 4:
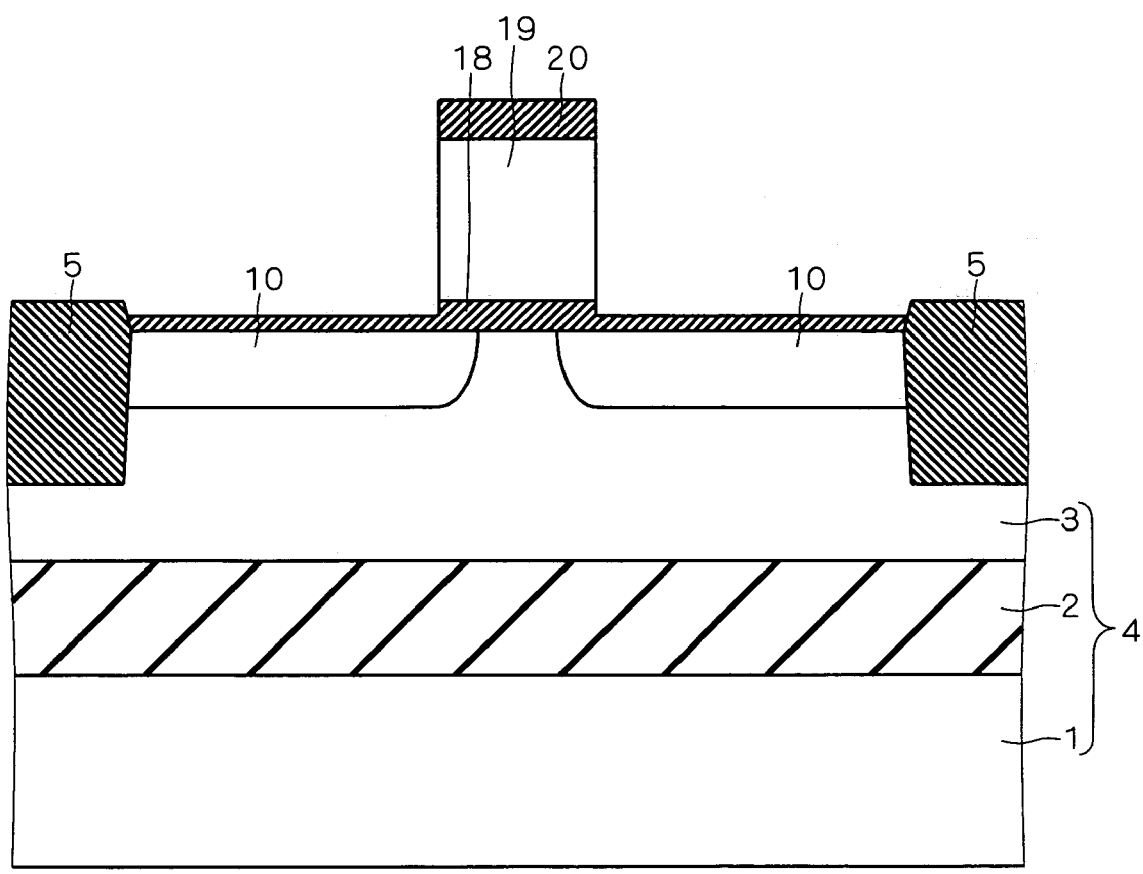

Next, referring to FIG. 4, n-type impurities are ion-implanted into the top surface of the silicon layer 3 through the silicon oxide film 18 to form the impurity-introduced regions 10. At this time, p-type impurity layers of relatively low concentration may be formed in order to suppress short channel effect (which are generally called "pocket regions"). However, the pocket regions are not described hereinafter, for the sake of simplicity of description.

Figure 5:
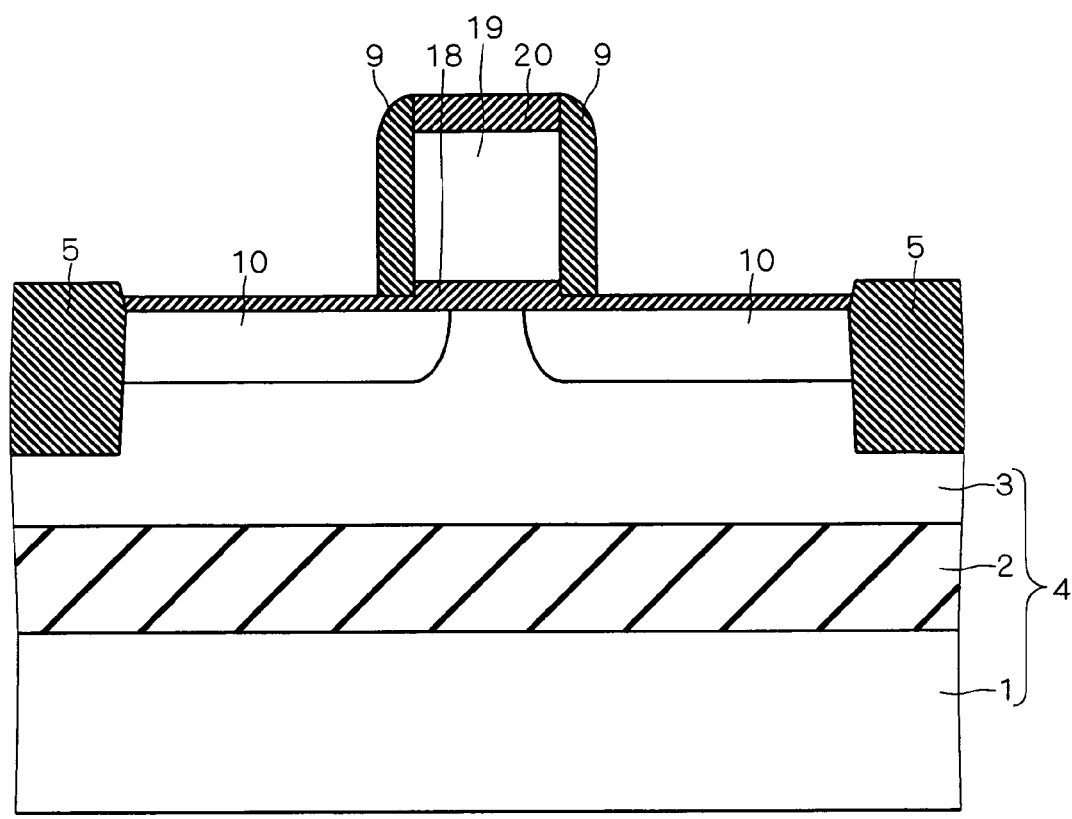

Next, referring to FIG. 5, a silicon nitride film is formed all over the surface by CVD. Next, by etch-back, the sidewalls 9 are formed on the sides of the polysilicon film 19 and the silicon oxide film 20.

Next, referring to FIG. 6, an etching process is performed under a condition in which silicon oxide film is readily etched and silicon, polysilicon, and silicon nitride films are not readily etched. Thus the silicon oxide film 20 is removed and the top surface of the polysilicon film 19 is exposed. Also, the parts of the silicon oxide film 18 that are not covered by the sidewalls 9 and the polysilicon film 19 are removed to form the gate insulating film 6. Though not shown, the element isolation insulating films 5, too, are somewhat etched during this etching process.

Next, referring to FIG. 7, an anisotropic dry-etching process is performed under a condition in which silicon and polysilicon are readily etched and silicon oxide film and silicon nitride film are less likely to be etched. Thus the portions of the silicon layer 3 that are not covered by the gate insulating film 6 and element isolation insulating films 5 are etched by a film thickness D1, so as to form the recesses 14. The top portion of the polysilicon film 19 is also etched, forming the gate electrode 7. The film thickness of the silicon layer 3 between the bottom surfaces of the recesses 14 and the top surface of the BOX layer 2 is D2.

Figure 8:
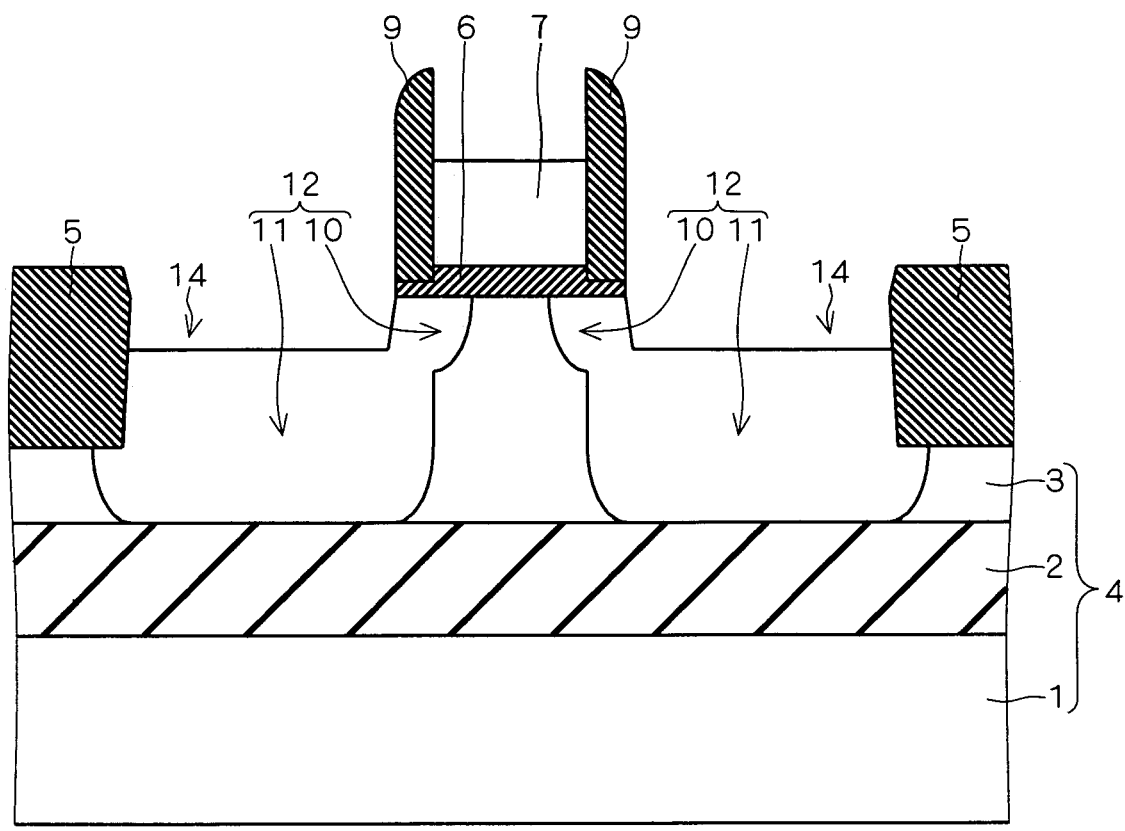

Next, referring to FIG. 8, n-type impurities are ion-implanted into the top surface of the silicon layer 3, so as to form the impurity-introduced regions 11. The ion implant energy is set so that the impurities implanted into the bottom surfaces of the recesses 14 reach the bottom surface of the silicon layer 3 and so that the impurities implanted into the top surfaces of the element isolation insulating films 5 do not pass through the element isolation insulating films 5.

During this ion implantation process, the n-type impurities are implanted also into the gate electrode 7. Since the polysilicon film 19 has been thinned to form the gate electrode 7, the impurities reach the depths of the gate electrode 7, i.e. reach the vicinity of the interface between the gate electrode 7 and the gate insulating film 6. This suppresses gate depletion. Suppressing gate depletion enhances current driving capability.

Subsequently, the top surfaces of the gate electrode 7 and the source/drain regions 12 are silicidized to form the cobalt silicide layers 8 and 13; the structure shown in FIG. 1 is thus obtained.

As shown above, according to the semiconductor device and manufacturing method of the first preferred embodiment, the silicon layer 3 is thinned through the formation of the recesses 14 and then the impurity-introduced regions 11 are formed by ion implantation. Therefore n-type impurities are not introduced into the portions of the p-type silicon layer 3 that are located between the bottom surfaces of the element isolation insulating films 5 and the top surface of the BOX layer 2, which avoids reduction of isolation breakdown voltage. Furthermore, since the impurity-introduced regions 11 reach the top surface of the BOX layer 2, the junction capacitance of the source/drain regions 12 is not increased.

During the dry-etching for forming the recesses 14, defects are formed in the silicon layer 3. The defects serve as a lifetime killer, suppressing the occurrence of substrate floating effect, a problem peculiar to semiconductor devices using SOI substrates.

While the first preferred embodiment has described an NMOS transistor as an example, the same effects can be obtained with PMOS transistors or CMOS transistors having NMOS and PMOS transistors in combination. The same applies also to the other preferred embodiments described later.

Second Preferred Embodiment.

FIG. 9 is a cross-sectional view showing the structure of a semiconductor device according to a second preferred embodiment of the present invention. The bottom surfaces of the sidewalls 9 are located below the bottom surface of the gate insulating film 6. That is, the silicon layer 3 is thinner in the portions where the sidewalls 9 reside than in the portion where the gate insulating film 6 resides.

FIGS. 10 to 15 are cross-sectional views showing a sequence of process steps for manufacturing the semiconductor device of the second preferred embodiment. First, the structure shown in FIG. 2 is obtained through the process shown in the first preferred embodiment.

Next, referring to FIG. 10, the silicon oxide film 15, polysilicon film 16 and silicon oxide film 17 are patterned by photolithography and anisotropic dry-etching. Thus the gate insulating film 6, polysilicon film 19 and silicon oxide film 20 are formed. Also, the portions of the silicon layer 3 that are not covered by the gate insulating film 6 and element isolation insulating films 5 are etched by over-etch to form recesses 21.

Figure 11:
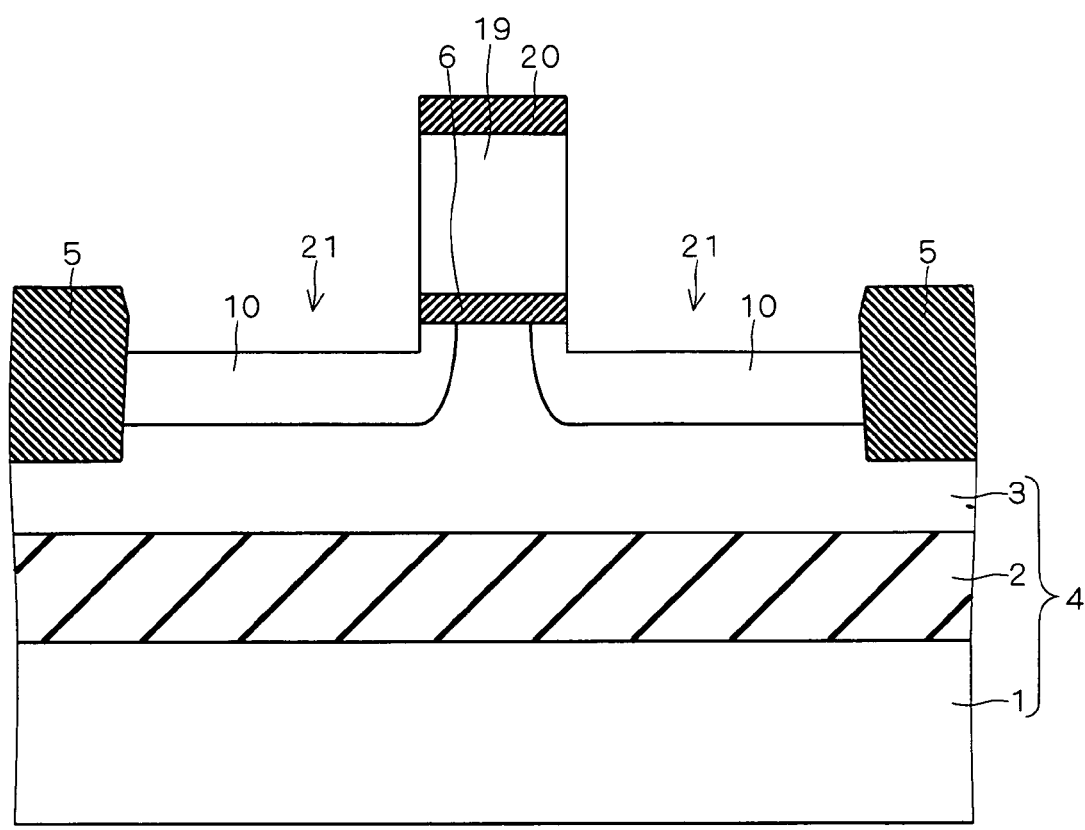

Next, referring to FIG. 11, n-type impurities are ion-implanted into the top surface of the silicon layer 3 to form impurity-introduced regions 10. The impurity-introduced regions 10 are formed inside the bottom surface of the recesses 21. The ion implant energy for forming the impurity-introduced regions 10 is set equal in the first and second preferred embodiments.

Figure 12:
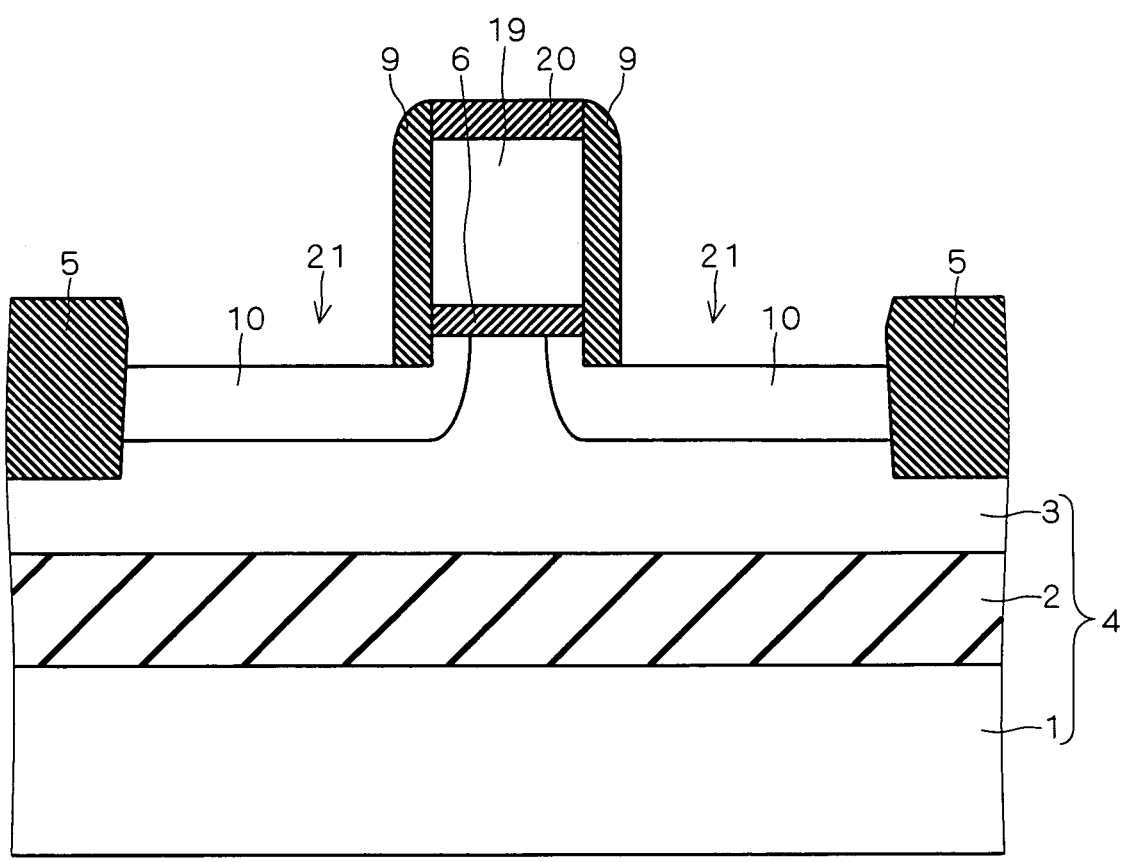

Next, referring to FIG. 12, a silicon nitride film is formed by CVD all over the surface, which is followed by etch-back to form sidewalls 9. The sidewalls 9 are formed on the bottom surfaces of the recesses 21 and are in contact with the side surfaces of the gate insulating film 6, polysilicon film 19 and silicon oxide film 20.

Next, referring to FIG. 13, an etching process is performed under a condition in which silicon oxide film is readily etched and silicon, polysilicon, and silicon nitride film are less likely to be etched. Thus the silicon oxide film 20 is removed to expose the top surface of the polysilicon film 19.

Figure 14:
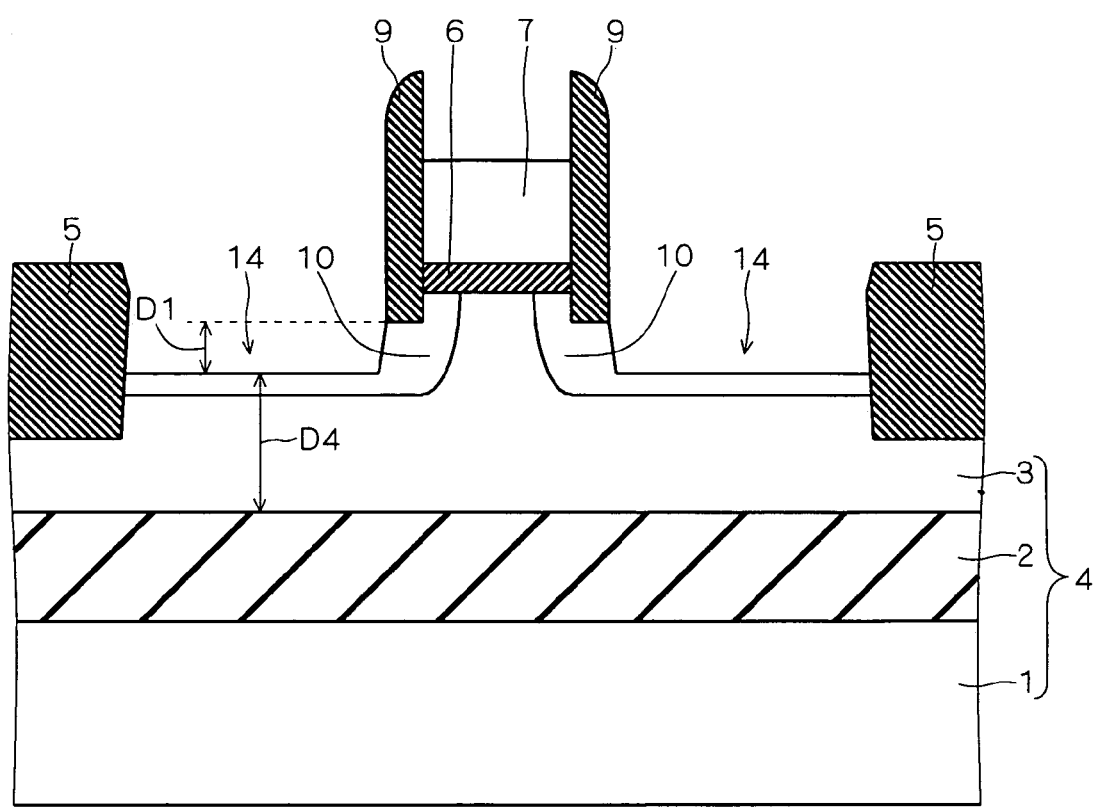

Next, referring to FIG. 14, an anisotropic dry-etching is performed under a condition in which silicon and polysilicon are readily etched and silicon oxide film and silicon nitride film are less readily etched. Thus the portions of the silicon layer 3 that are not covered by the sidewalls 9, gate insulating film 6 and element isolation insulating films 5 are etched by the thickness D1; thus the recesses 14 are formed. The top portion of the polysilicon film 19 is also etched, forming the gate electrode 7. The film thickness D4 of the silicon layer 3 between the bottom surfaces of the recesses 14 and the top surface of the BOX layer 2 is smaller by the film thickness D3 than the film thickness D2 shown in FIG. 7.

Figure 15:
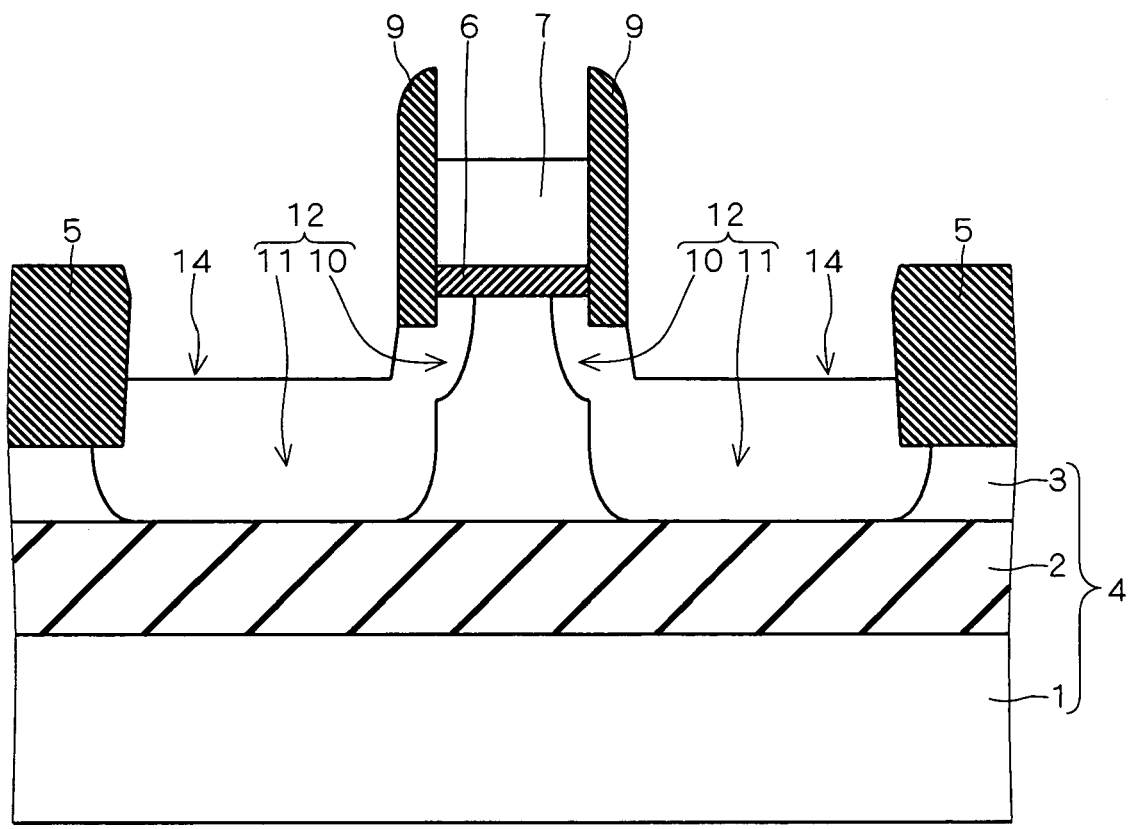

Next, referring to FIG. 15, as in the first preferred embodiment, n-type impurities are ion-implanted into the top surface of the silicon layer 3 to form impurity-introduced regions 11. As shown above, the film thickness D4 of the silicon layer 3 of the second preferred embodiment is smaller than the film thickness D2 of the silicon layer 3 of the first preferred embodiment. Therefore, in the second preferred embodiment, the ion implant energy for the formation of the impurity-introduced regions 11 can be set lower than that in the first preferred embodiment.

Subsequently, the top surfaces of the gate electrode 7 and the source/drain regions 12 are silicidized to form cobalt silicide layers 8 and 13; the structure shown in FIG. 9 is thus obtained.

As shown above, according to the semiconductor device and manufacturing method of the second preferred embodiment, the ion implant energy for forming the impurity-introduced regions 11 can be set lower than in the first preferred embodiment. Therefore it is possible to more certainly prevent, than in the first preferred embodiment, the impurities implanted into the top surfaces of the element isolation insulating films 5 from passing through the element isolation insulating films 5.

FIG. 16 is a cross-sectional view showing a process step of a modification of the semiconductor device manufacturing method of the second preferred embodiment. While the silicon layer 3 is etched by the film thickness D1 in the process step shown in FIG. 14, the silicon layer 3 may be etched by a film thickness D5 (<D1) as shown in FIG. 16, so as to form recesses 22. The film thickness of the silicon layer 3 between the bottom surfaces of the recesses 22 and the top surface of the BOX layer 2 is equal to the film thickness D2 shown in FIG. 7.

According to the semiconductor device and manufacturing method of the modification of the second preferred embodiment, the interval between the pair of impurity-introduced regions 11 can be kept approximately equal to that in the first preferred embodiment. Therefore, as compared with the structure of FIG. 9, the influence of short channel effect can be suppressed more effectively.

Furthermore, the impurity-introduced regions 10 are formed deeper by the film thickness D3 than those of the first preferred embodiment. This enlarges the overlap between the impurity-introduced regions 10 and the impurity-introduced regions 11 as compared with that in the first preferred embodiment. As a result, the parasitic resistance of the source/drain regions 12 can be lower than in the first preferred embodiment.

Third Preferred Embodiment.

Figure 17:
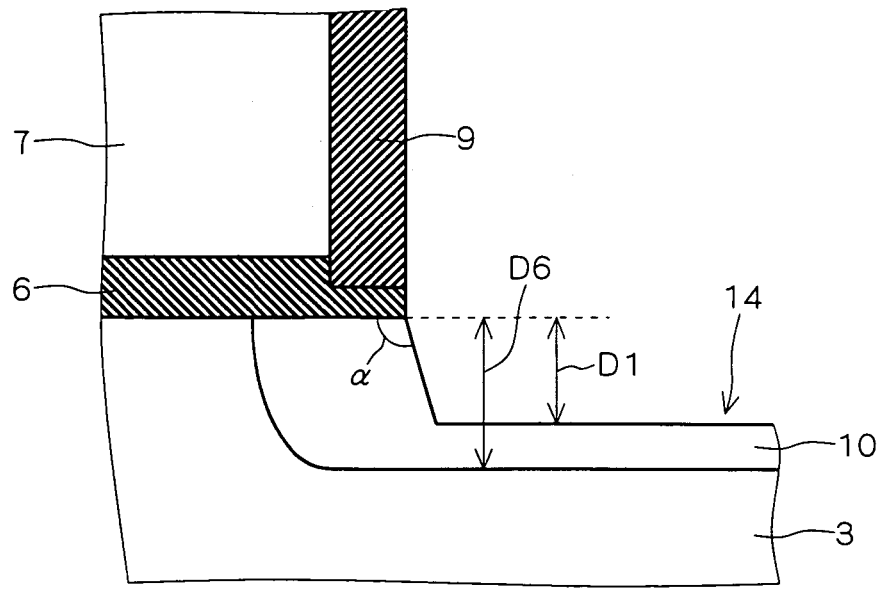
FIGS. 17 and 18 are cross-sectional views showing a third preferred embodiment of the present invention, where a portion in the vicinity of a recess in the structure of FIG. 7 is shown in an enlarged manner.
Figure 18:
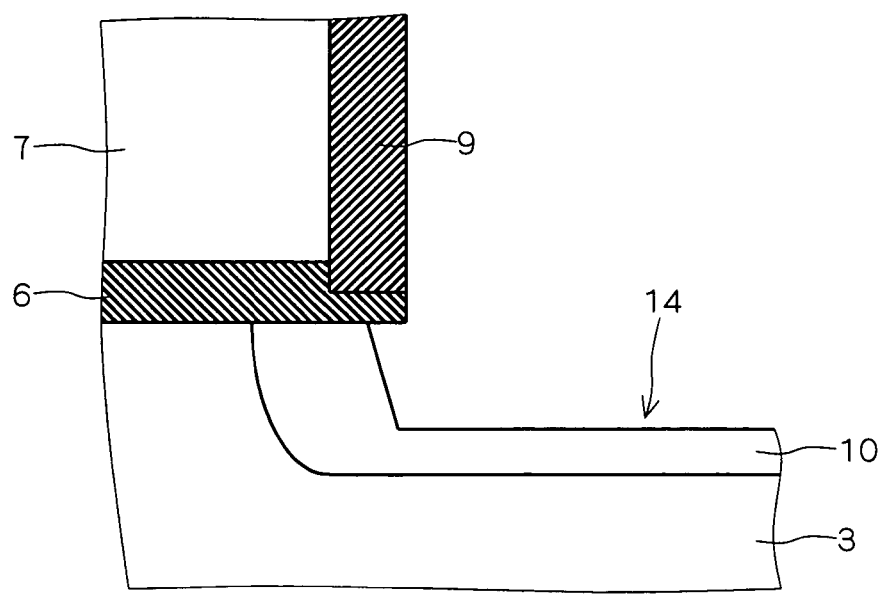

FIGS. 17 and 18 are cross-sectional views showing, in an enlarged manner, a portion in the vicinity of a recess 14 of the structure of FIG. 7. Referring to FIG. 17, the part of the top surface of the silicon layer 3 where the gate insulating film 6 resides and the side surface of the recess 14 form an angle α that is larger than 90°. The angle α can be controlled through the amount of $O_2$ gas added to the etching gas, such as $Cl_2$ or HBr.

In the structure shown in FIG. 1, setting the angle α larger than 90° allows a relatively long distance between the cobalt silicide layer 13 and the channel formation region. This reduces the junction leakage current flowing between the cobalt silicide layer 13 and the channel formation region.

Also, referring to FIG. 17, the depth (film thickness D1) from the top surface of the silicon layer 3 to the bottom surface of the recess 14 is smaller than the depth D6 from the top surface of the silicon layer 3 to the bottom surface of the impurity-introduced region 10. The depth of the recess 14 can be controlled through etching time.

The increase in the parasitic resistance of the impurity-introduced regions 10 due to the formation of the recesses 14 can thus be suppressed by setting D1<D6.

Referring now to FIG. 18, the edge of the recess 14 may be positioned beneath the edge region of the gate insulating film 6. Such a structure can be obtained by etching the silicon layer 3 by isotropic etching, for example.

When the recesses 14 are thus positioned beneath the edge regions of the gate structure, defects serving as a lifetime killer can be formed closer to the channel formation region. This more effectively suppresses the occurrence of substrate floating effect.

Fourth Preferred Embodiment.

Figure 19:
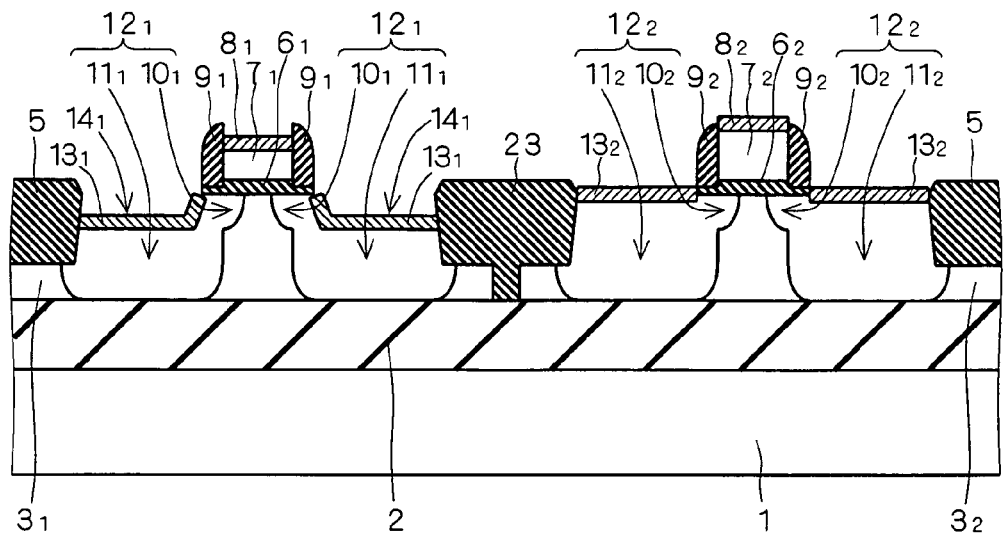
FIG. 19 is a cross-sectional view showing the structure of a semiconductor device according to a fourth preferred embodiment of the present invention.

FIG. 19 is a cross-sectional view showing the structure of a semiconductor device according to a fourth preferred embodiment of the present invention. The SOI substrate 4 has an NMOS transistor and a PMOS transistor. The NMOS transistor has a p-type silicon layer $3_1$, a gate insulating film $6_1$, a gate electrode $7_1$, cobalt silicide layers $8_1$, $13_1$, sidewalls $9_1$, and n-type source/drain regions $12_1$. The source/drain regions $12_1$ include impurity-introduced regions $10_1$ and $11_1$. As shown in the first preferred embodiment, the NMOS transistor adopts the structure in which the source/drain regions $12_1$ are formed inside the bottom surfaces of the recesses $14_1$ (this structure is called "recessed source/drain structure" in this specification).

As explained in the first preferred embodiment, adopting the recessed source/drain structure suppresses the occurrence of substrate floating effect. In general, the substrate floating effect causes more serious problems in NMOS transistors than in PMOS transistors. Therefore the occurrence of substrate floating effect in NMOS transistors can be suppressed by adopting the recessed source/drain structure in NMOS transistors.

Further, the recessed source/drain structure causes the cobalt silicide layers $13_1$ to pull the channel formation region, thereby increasing stress generated in the silicon layer $3_1$ as compared with the case where the recessed source/drain structure is not adopted. As a result, carrier mobility is enhanced. That is, the recessed source/drain structure improves current driving capability of the NMOS transistor.

The PMOS transistor includes an n-type silicon layer $3_2$, a gate insulating film $6_2$, a gate electrode $7_2$, cobalt silicide layers $8_2$, $13_2$, sidewalls $9_2$, and p-type source/drain regions $12_2$. The source/drain regions $12_2$ include impurity-introduced regions $10_2$ and $11_2$. The PMOS transistor does not adopt the recessed source/drain structure; like conventional semiconductor devices, it adopts a common source/drain structure in which impurity-introduced regions $10_2$ and $11_2$ are formed inside the top surface of the silicon layer $3_2$.

When the recessed source/drain structure is not adopted, the interval between the pair of impurity-introduced regions 11 can be larger particularly in a deep portion of the silicon layer 3, than when the recessed source/drain structure is adopted. This suppresses the occurrence of short channel effect. In general, the short channel effect causes more serious problems in PMOS transistors than in NMOS transistors. Therefore, when the performance of transistors has priority over the isolation breakdown voltage, the short channel effect in PMOS transistors can be improved by not adopting the recessed source/drain structure in PMOS transistors.

As discussed, the recessed source/drain structure causes the cobalt silicide layers 13 to pull the channel formation region, thereby increasing stress generated in the silicon layer 3. Conversely, the increase in such stress degrades carrier mobility of the PMOS transistor. That is, with respect to the PMOS transistor, degradation in current driving capability is prevented with no adoption of the recessed source/drain structure.

A so-called complete-isolation type element isolation insulating film 23 is formed between the NMOS transistor and PMOS transistor; part of the bottom surface of the element isolation insulating film 23 reaches the top surface of the BOX layer 2. This electrically isolates the NMOS transistor and the PMOS transistor. This isolation structure suppresses latch up. This isolation structure can be applied to all other preferred embodiments.

Figure 20:
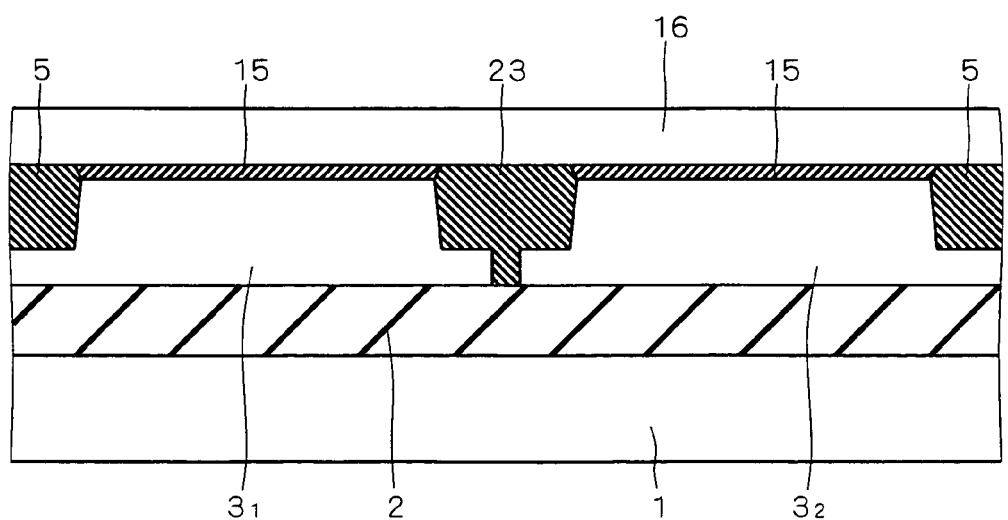
FIGS. 20 to 27 are cross-sectional views showing a sequence of process steps for manufacturing the semiconductor device of the fourth preferred embodiment of the present invention.

FIGS. 20 to 27 are cross-sectional views showing a sequence of process steps for manufacturing the semiconductor device of the fourth preferred embodiment. Referring to FIG. 20, a silicon oxide film 15 is formed on the top surfaces of the silicon layers $3_1$ and $3_2$ by thermal oxidation. Next, a polysilicon film 16 is formed all over the surface by CVD.

Figure 21:
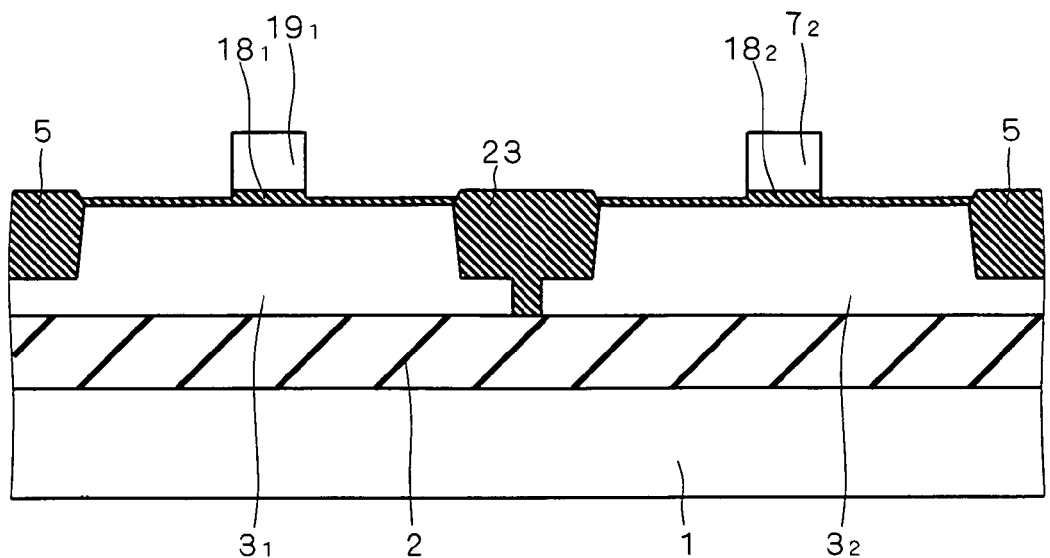

Next, referring to FIG. 21, the polysilicon film 16 is patterned by photolithography and anisotropic dry-etching. Thus a polysilicon film $19_1$ and the gate electrode $7_2$ are formed. Also, the silicon oxide film 15 is partially etched to form silicon oxide films $18_1$ and $18_2$.

Figure 22:
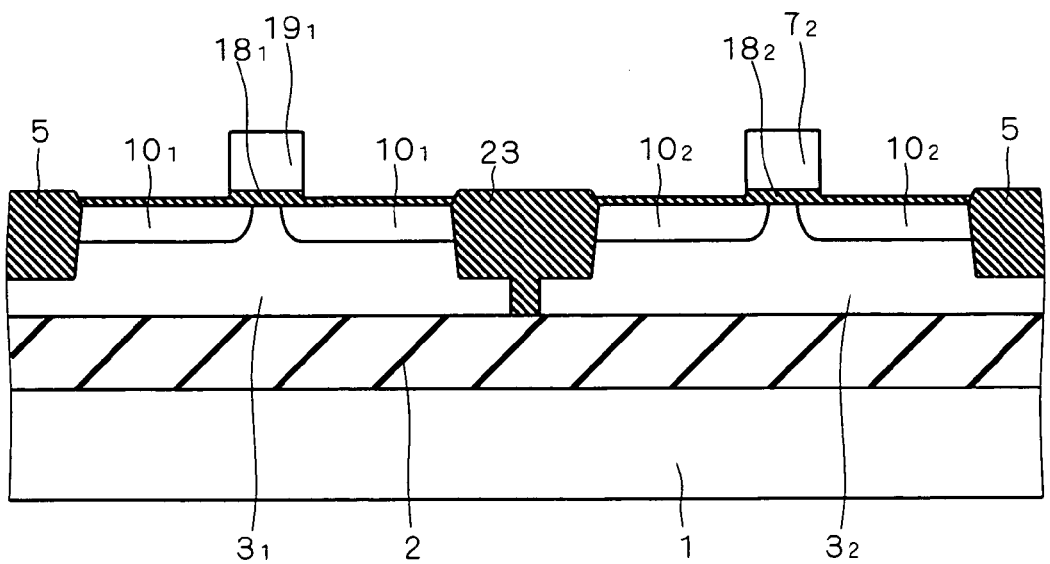

Next, referring to FIG. 22, n-type impurities are implanted by photolithography and ion implantation into the top surface of the silicon layer $3_1$ through the silicon oxide film $18_1$, so as to form the impurity-introduced regions $10_1$. Next, p-type impurities are implanted by photolithography and ion implantation into the top surface of the silicon layer $3_2$ through the silicon oxide film $18_2$, so as to form the impurity-introduced regions $10_2$.

Figure 23:
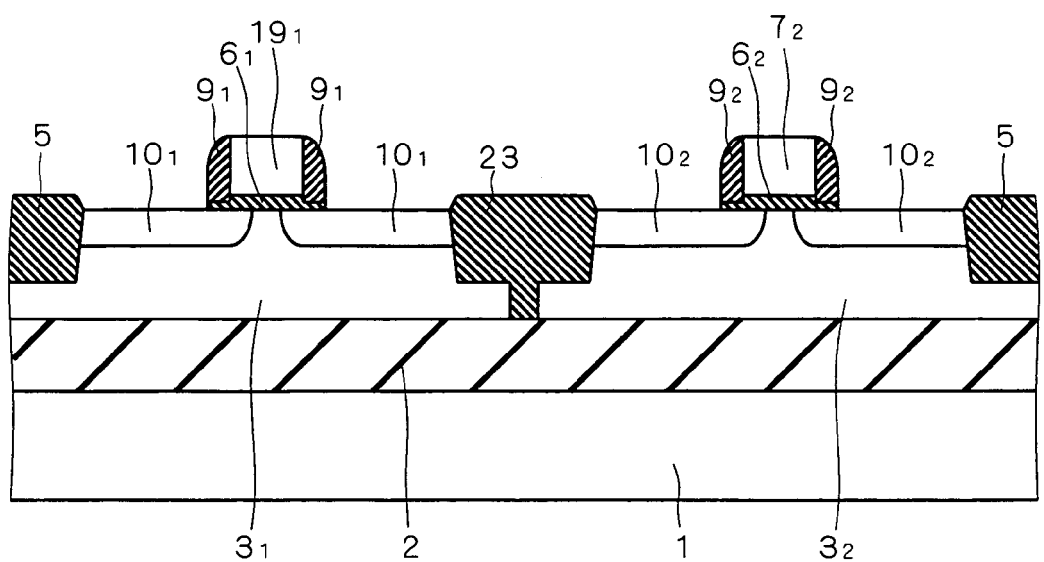

Next, referring to FIG. 23, a silicon nitride film is formed by CVD all over the surface, which is followed by an etch-back. Then the sidewalls $9_1$ are formed on the side surfaces of the polysilicon film $19_1$ and sidewalls $9_2$ are formed on the side surfaces of the gate electrode $7_2$. The gate insulating films $6_1$ and $6_2$ are formed, too.

Figure 24:
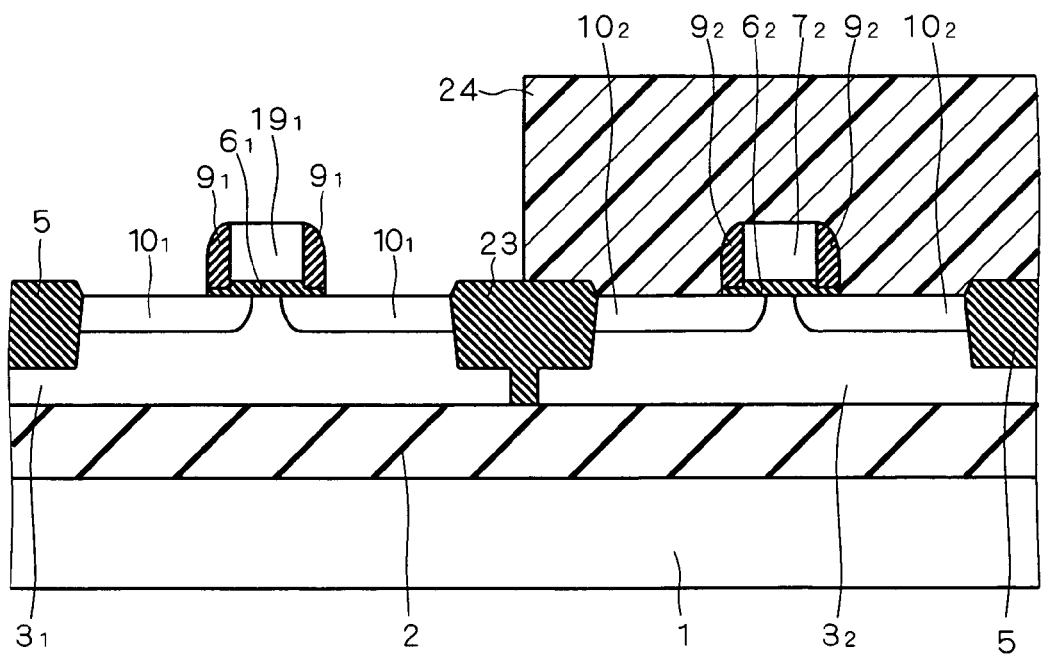

Next, referring to FIG. 24, photoresist 24 is formed by photolithography to cover the area where the PMOS transistor is to be formed.

Figure 25:
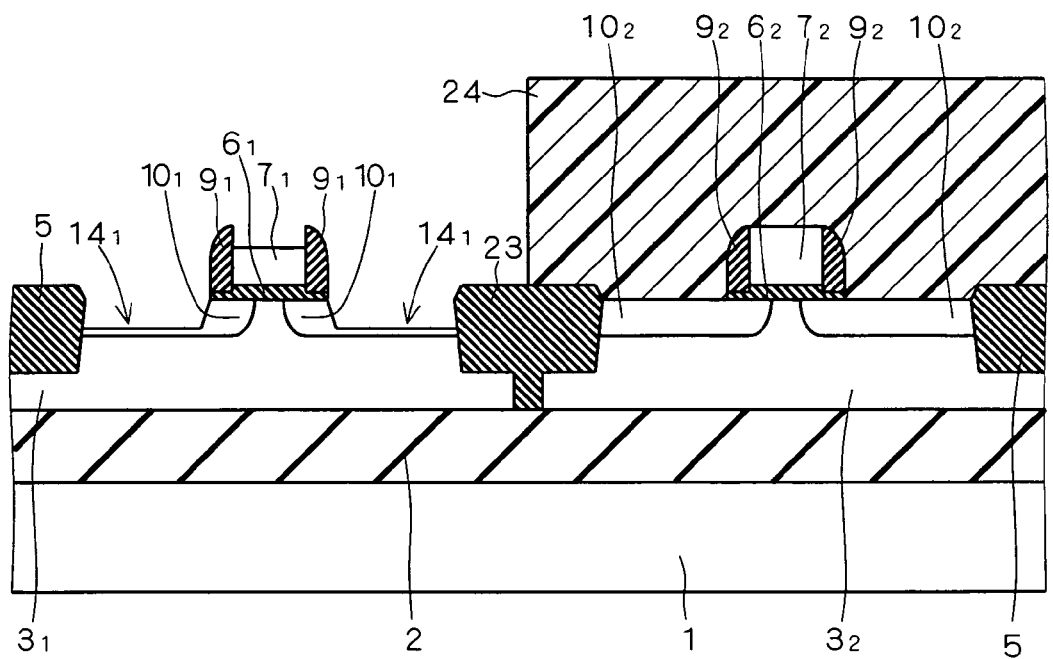

Next, referring to FIG. 25, using the photoresist 24 as an etching mask, an anisotropic dry-etching process is performed under a condition in which silicon and polysilicon are readily etched and silicon oxide film and silicon nitride film are not readily etched. This etches the parts of the silicon layer $3_1$ that are not covered by the photoresist 24, gate insulating film $6_1$ and element isolation insulating films 5 and 23; the recesses $14_1$ are thus formed. The top portion of the polysilicon film $19_1$ is also etched to form the gate electrode $7_1$.

Figure 26:
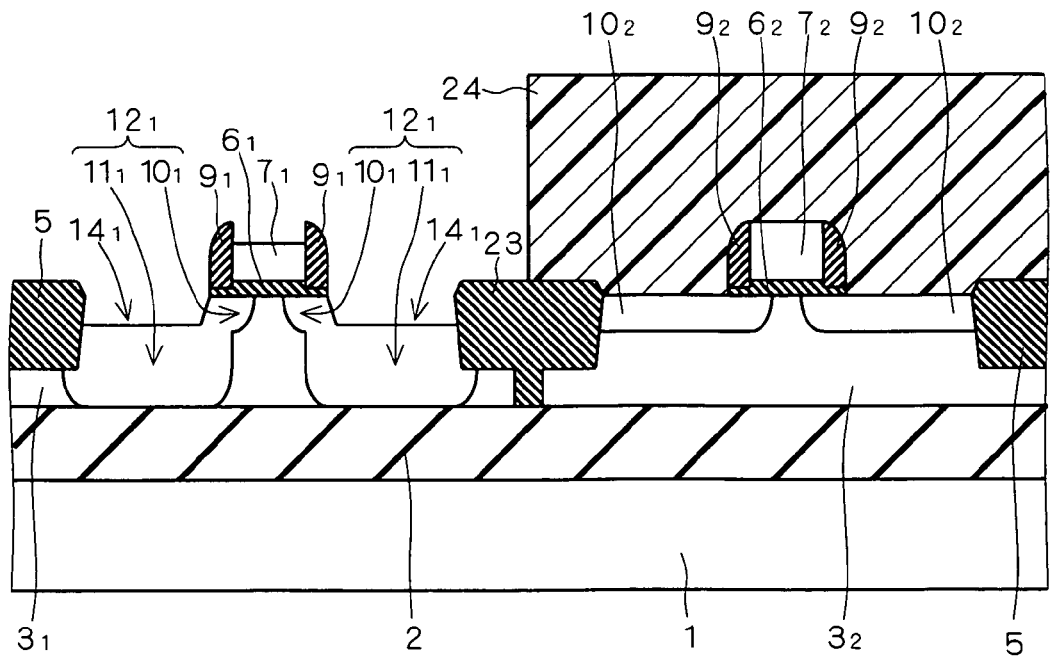

Next, referring to FIG. 26, using the photoresist 24 as an implant mask, n-type impurities are implanted by ion-implantation into the top surface of the silicon layer $3_1$ to form impurity-introduced regions $11_1$. The n-type impurities are implanted also into the gate electrode $7_1$. The photoresist 24 is then removed.

Figure 27:
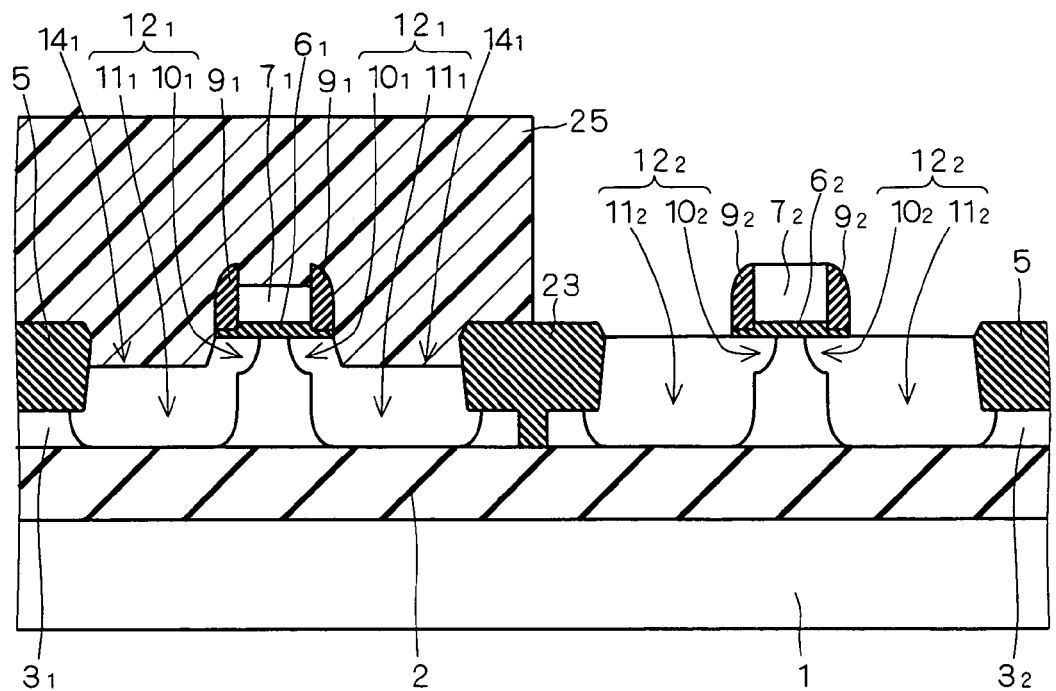

Next, referring to FIG. 27, photoresist 25 is formed by photolithography to cover the area where the NMOS transistor is to be formed. Next, using the photoresist 25 as an implant mask, p-type impurities are implanted by ion-implantation into the top surface of the silicon layer $3_2$ to form impurity-introduced regions $11_2$. The p-type impurities are implanted also into the gate electrode $7_2$. The photoresist 25 is then removed.

Subsequently, the top surfaces of the gate electrodes $7_1$, $7_2$ and the source/drain regions $12_1$ and $12_2$ are silicidized to form cobalt silicide layers $8_1$, $8_2$, $13_1$ and $13_2$; the structure shown in FIG. 19 is thus obtained.

Figure 28:
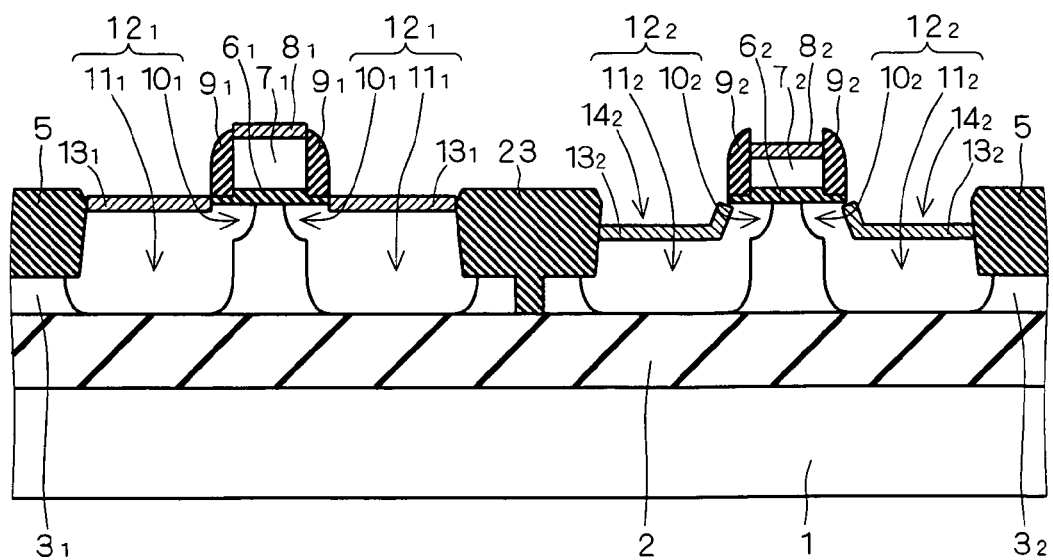
FIG. 28 is a cross-sectional view showing the structure of a semiconductor device according to a modification of the fourth preferred embodiment of the present invention.

FIG. 28 is a cross-sectional view showing the structure of a semiconductor device according to a modification of the fourth preferred embodiment. The PMOS transistor adopts the recessed source/drain structure in which the source/drain regions $12_2$ are formed inside the bottom surfaces of the recesses $14_2$ as shown in the first preferred embodiment.

As stated in the first preferred embodiment, gate depletion can be suppressed by thinning the gate polysilicon through the adoption of the recessed source/drain structure. In general, the gate depletion causes more serious problems in PMOS transistors than in NMOS transistors. Therefore gate depletion in PMOS transistors can be effectively suppressed by adopting the recessed source/drain structure in PMOS transistors.

The NMOS transistor does not adopt the recessed source/drain structure; like conventional semiconductor devices, it adopts a common source/drain structure.

When the recessed source/drain structure is not adopted, the parasitic resistance of the source/drain regions 12 is smaller than when the recessed source/drain structure is adopted. This is because the area of the impurity-introduced regions $10_2$ and $11_2$ is not reduced when the recesses 14 are absent. In general, more NMOS transistors, than PMOS transistors, are used in devices requiring high-speed operations, such as logic circuits. Thus, reduction of operating speed due to increased parasitic resistance of source/drain regions 12 can be avoided by not adopting the recessed source/drain structure in NMOS transistors.

FIGS. 19 and 28 show structures in which the recessed source/drain structure is adopted only in NMOS transistors or only in PMOS transistors. However, the recessed source/drain structure may be adopted in both of NMOS and PMOS transistors.

Fifth Preferred Embodiment.

Figure 29:
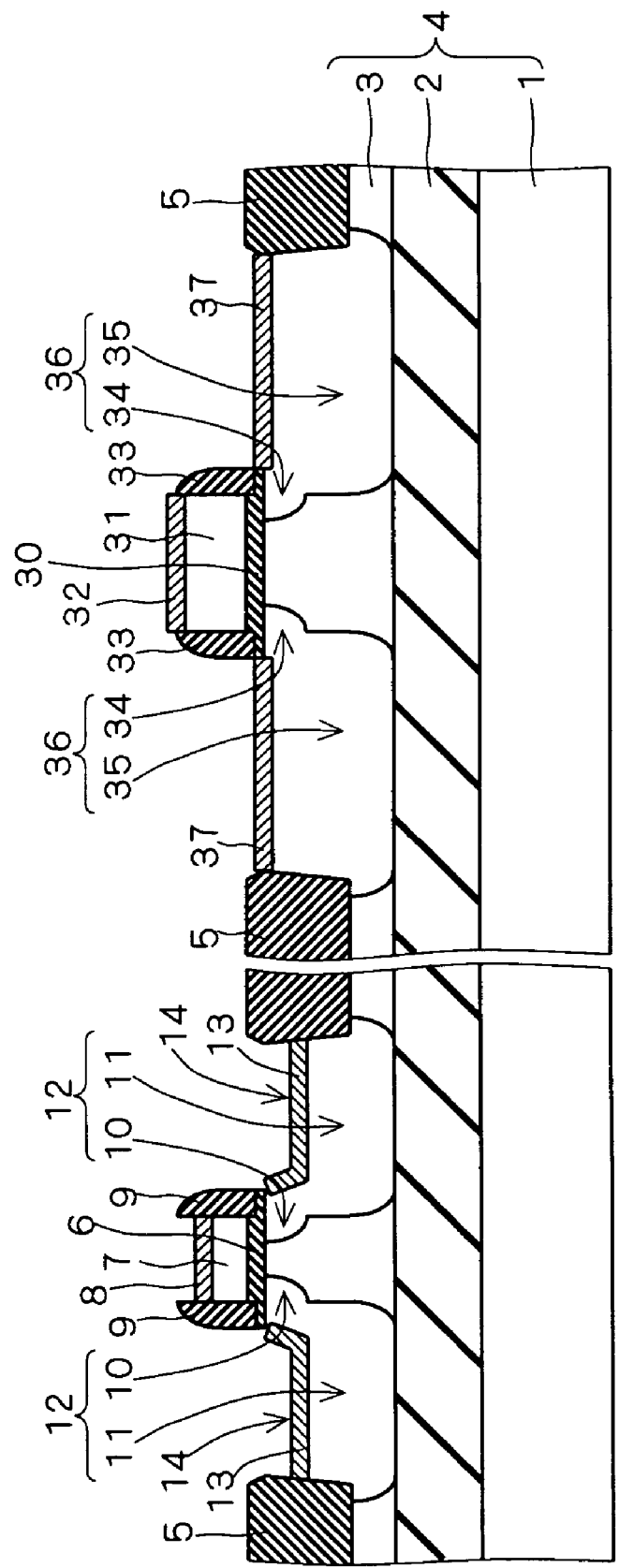
FIG. 29 is a cross-sectional view showing the structure of a semiconductor device according to a fifth preferred embodiment of the present invention.

FIG. 29 is a cross-sectional view showing the structure of a semiconductor device according to a fifth preferred embodiment of the present invention. The SOI substrate 4 has an MOS transistor that operates at a relatively low power-supply voltage (e.g. 1.0 V: this transistor is referred to as a low-voltage operation transistor hereinafter) and an MOS transistor that operates at a relatively high power-supply voltage (e.g. 3.3 V: this transistor is referred to as a high-voltage operation transistor hereinafter). The low-voltage operation transistor is a transistor that forms a CPU core, for example. The high-voltage operation transistor is a transistor that forms input/output circuitry, for example.

The low-voltage operation transistor includes a gate insulating film 6, a gate electrode 7, cobalt silicide layers 8, 13, sidewalls 9, and source/drain regions 12. The source/drain regions 12 include impurity-introduced regions 10 and 11. The low-voltage operation transistor adopts the recessed source/drain structure.

Applying the recessed source/drain structure to the low-voltage operation transistor suppresses the occurrence of substrate floating effect and reduction of isolation breakdown voltage.

The high-voltage operation transistor includes a gate insulating film 30, a gate electrode 31, cobalt silicide layers 32, 37, sidewalls 33, and source/drain regions 36. The source/drain regions 36 include impurity-introduced regions 34 and 35. The high-voltage operation transistor does not adopt the recessed source/drain structure.

For example, while the gate length of the low-voltage operation transistor is about 80 nm, the gate length of the high-voltage operation transistor is about 0.4 µm. That is to say, the high-voltage operation transistor has a longer gate length than the low-voltage operation transistor. Accordingly, in the high-voltage operation transistor, the reduction of isolation breakdown voltage can be suppressed by forming thick element isolation insulating films 5 so as to make a large height difference between the top surfaces of the element isolation insulating films 5 and the top surface of the silicon layer 3. Even if the dimensions of the gate electrode 31 vary because of the large height difference, the dimensional variation will not cause severe operating speed reduction or characteristic variation, since the gate length is originally long.

In the top surface of the SOI substrate 4, the input/output circuitry occupies a sufficiently smaller area than the CPU core. Therefore, even if large design rule is set about the input/output circuitry, it does not considerably enlarge the IC chip size. When large design rule is set, the element isolation insulating films 5 provide a large isolation length, so that a desired isolation breakdown voltage can be ensured even without adopting the recessed source/drain structure.

When thicker element isolation insulating films 5 or larger design rule is thus allowable, the recessed source/drain structure may be applied only to low-voltage operation transistors, while not applying it to high-voltage operation transistors. As stated earlier, the operating speed reduction due to an increase in parasitic resistance can be avoided by not adopting the recessed source/drain structure.

Figure 30:
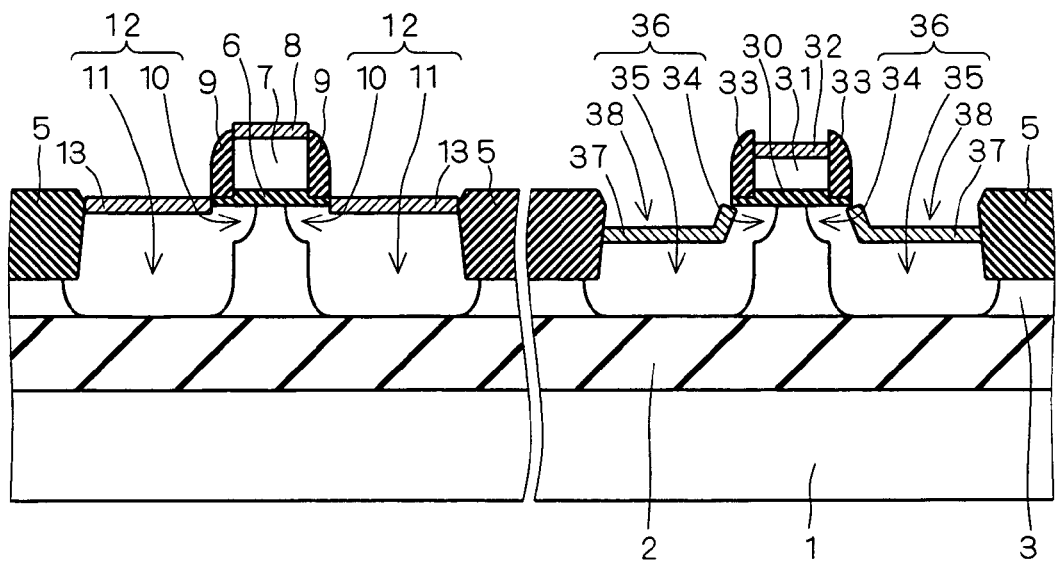
FIG. 30 is a cross-sectional view showing the structure of a semiconductor device according to a modification of the fifth preferred embodiment of the present invention.

FIG. 30 is a cross-sectional view showing the structure of a semiconductor device according to a modification of the fifth preferred embodiment. The high-voltage operation transistor adopts the recessed source/drain structure in which the source/drain regions 36 are formed inside the bottom surfaces of the recesses 38.

In some cases, thick element isolation insulating films 5 or large design rule may be unallowable in input/output circuitry. In such cases, high-voltage operation transistors are required to exhibit higher isolation breakdown voltage than low-voltage operation transistors. This is because higher power-supply voltage is applied to high-voltage operation transistors than to low-voltage operation transistors. In such cases, the isolation breakdown voltage can be enhanced by applying the recessed source/drain structure to the high-voltage operation transistors.

On the other hand, a common source/drain structure is applied to the low-voltage operation transistor, without adopting the recessed source/drain structure.

As stated earlier, the parasitic resistance of the source/drain regions 12 can be smaller when the recessed source/drain structure is not adopted, because of the absence of recesses 14. Thus, in the CPU core that is required to operate at high speed, the recessed source/drain structure is not adopted to low-voltage operation transistors, so as to avoid reduction of operating speed caused by increased parasitic resistance.

FIGS. 29 and 30 show examples in which the recessed source/drain structure is applied only to the low-voltage operation transistor or only to the high-voltage operation transistor. However, the recessed source/drain structure may be applied to both of low-voltage and high-voltage operation transistors.

When it is desirable to apply the recessed source/drain structure only to low-voltage operation transistors or only to high-voltage operation transistors, the source/drain regions can be constructed in different ways by using photoresists 24 and 25 as described in the fourth preferred embodiment.

Also, when NMOS-structured low-voltage transistors and PMOS-structured low-voltage transistors are used together, the recessed source/drain structure may be applied only to NMOS transistors or only to PMOS transistors, as described in the fourth preferred embodiment. The same applies to devices in which NMOS-structured high-voltage transistors and PMOS-structured high-voltage operation transistors are used together.

Sixth Preferred Embodiment.

Figure 31:
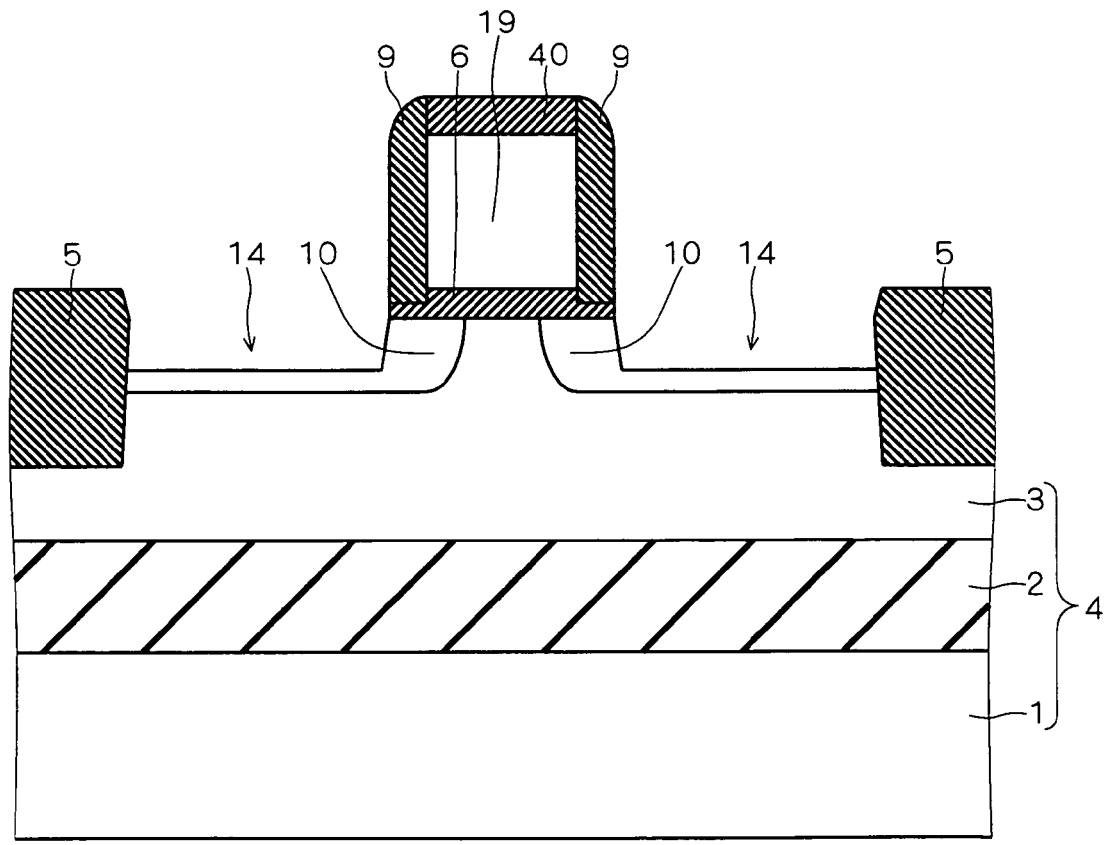
FIG. 31 is a cross-sectional view showing a process step for manufacturing a semiconductor device according to a sixth preferred embodiment of the present invention.

FIG. 31 is a cross-sectional view showing a process step of a method for manufacturing a semiconductor device according to a sixth preferred embodiment. In the first and other preferred embodiments shown above, the etching process for forming the recesses 14 is performed after the silicon oxide film 20 on the polysilicon film 19 has been removed. Accordingly, as shown in FIG. 7, the gate electrode 7 is formed as a result of the thinning of the polysilicon film 19 by the etching.

In contrast, in the sixth preferred embodiment, as shown in FIG. 31, a silicon nitride film 40 is formed on the polysilicon film 19 in place of the silicon oxide film 20. Then, the silicon nitride film 40 is not etched during the process step shown in FIG. 6. Thus, during the etching process for forming the recesses 14, the silicon nitride film 40 serves as an etching mask to prevent the polysilicon film 19 from being etched. In this way, the intact polysilicon film 19 forms the gate electrode.

In the ion implantation process step for forming the impurity-introduced regions 11 (FIG. 8), impurities are ion-implanted also into the polysilicon film 19 through the silicon nitride film 40.

As shown above, according to the semiconductor device and manufacturing method of the sixth preferred embodiment, the gate electrode is thicker than that of the first preferred embodiment. In the ion-implantation process for formation of the impurity-introduced regions 11, this suppresses the phenomenon that impurities implanted into the polysilicon film 19 pass through the polysilicon film 19 to reach the gate insulating film 6 or the channel formation region. Then threshold voltage variation due to impurity penetration can be suppressed.

Also, since the film thickness of the intact polysilicon film 19 defines the film thickness of the gate electrode, the gate electrode thickness can be controlled easier than in first and other preferred embodiments.

The recessed source/drain structure of the sixth preferred embodiment can be applied also to all other preferred embodiments.

Seventh Preferred Embodiment.

Figure 32:
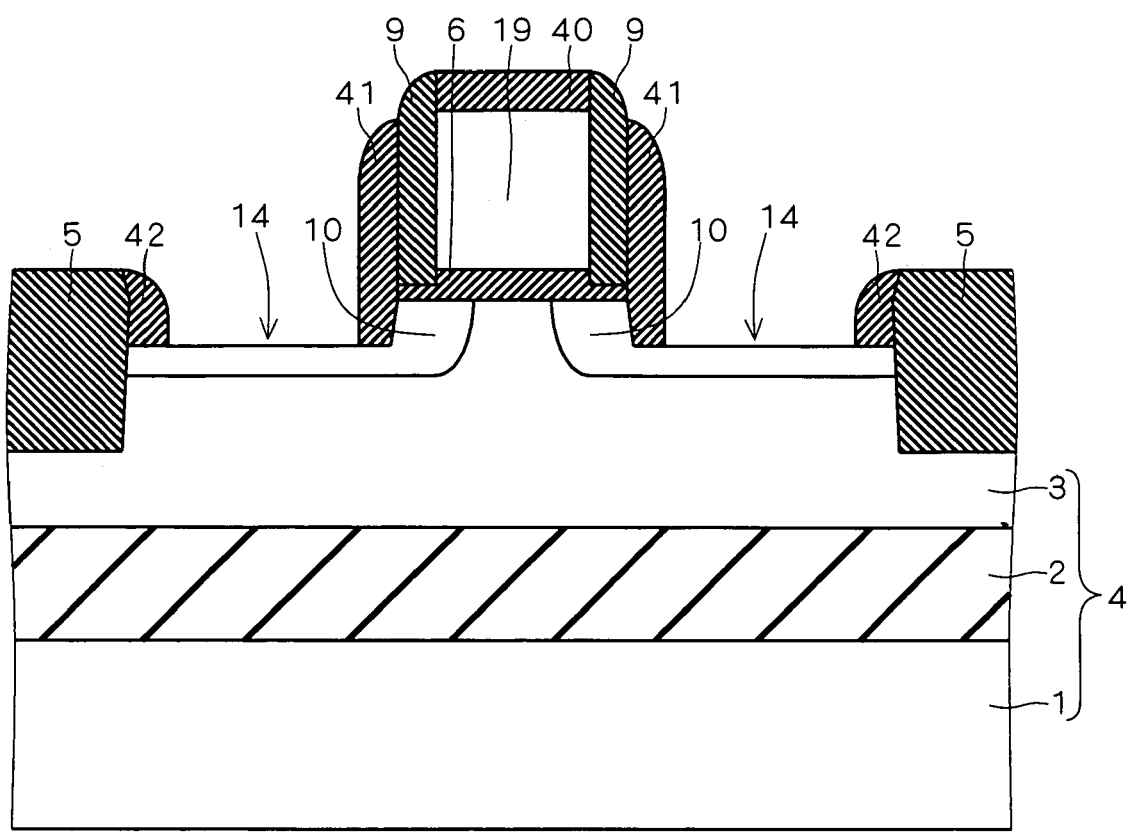

FIGS. 32, 33 are cross-sectional views showing a sequence of process steps for manufacturing a semiconductor device according to a seventh preferred embodiment of the present invention. Referring to FIG. 32, after the structure shown in FIG. 31 is obtained, a silicon nitride film or a silicon oxide film is formed by CVD all over the surface. Next, the silicon nitride film or silicon oxide film is etched back to form sidewalls 41 and 42. The sidewalls 41 are formed on the bottoms of the recesses 14 and in contact with the side surfaces of the sidewalls 9. The sidewalls 42 are formed on the bottoms of the recesses 14 in contact with side surfaces of the element isolation insulating films 5.

Next, referring to FIG. 33, the impurity-introduced regions 11 are formed by ion implantation. Next, the top surfaces of the source/drain regions 12 are silicidized to form cobalt silicide layers 43. The cobalt silicide layers 43 are formed on the bottoms of the recesses 14 that are not covered by the sidewalls 41 and 42.

While the semiconductor device manufacturing method of the seventh preferred embodiment has been described on the basis of the sixth preferred embodiment, the invention of the seventh preferred embodiment can be applied to all other preferred embodiments.

Also, while, in the description above, the impurity-introduced regions 11 are formed after the formation of the sidewalls 41, the sidewalls 41 may be formed after the formation of the impurity-introduced regions 11.

When the height difference between the top surfaces of the element isolation insulating films 5 and the bottom surfaces of the recesses 14 is small, it is then not essential to form the sidewalls 42.

When the semiconductor device manufacturing method of the seventh preferred embodiment includes a process step of forming silicide protection film (a silicide protection process), the sidewalls 41 and 42 may be formed as part of the silicide protection film. The silicide protection process is a process for forming polysilicon film that is not silicidized and is hence highly resistant. Forming the sidewalls 41 and 42 during the silicide protection process avoids an increase in the number of manufacturing steps.

Thus, according to the semiconductor device and manufacturing method of the seventh preferred embodiment, the formation of the sidewalls 41 enlarges the distances between the cobalt silicide layers 43 and the channel formation region. This reduces the junction leakage current flowing between the cobalt silicide layers 43 and the channel formation region.

Furthermore, the formation of the sidewalls 42 enlarges the distances between the cobalt silicide layers 43 and the portions of the silicon layer 3 that ate located under the element isolation insulating films 5. This reduces the junction leakage current flowing between the cobalt silicide layers 43 and these portions of the silicon layer 3.

Eighth Preferred Embodiment.

Figure 34:
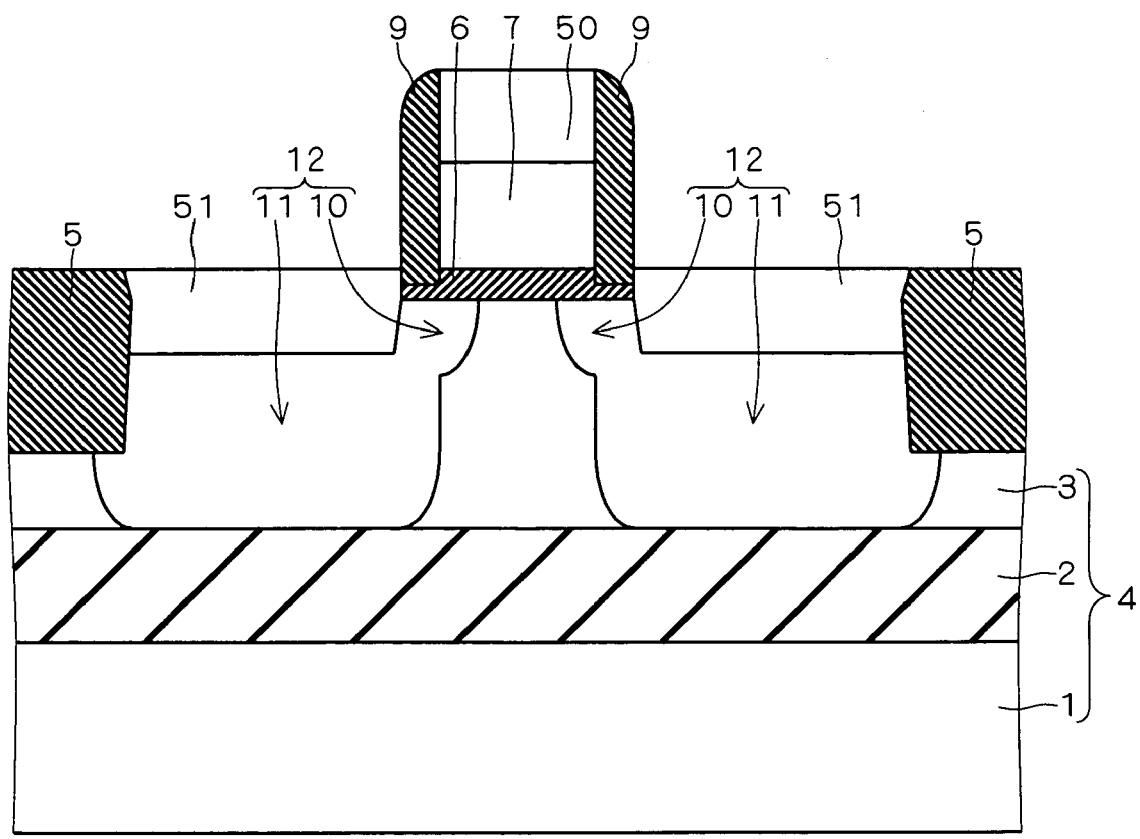
FIGS. 34 and 35 are cross-sectional views showing a sequence of process steps for manufacturing a semiconductor device of an eighth preferred embodiment of the present invention.
Figure 35:
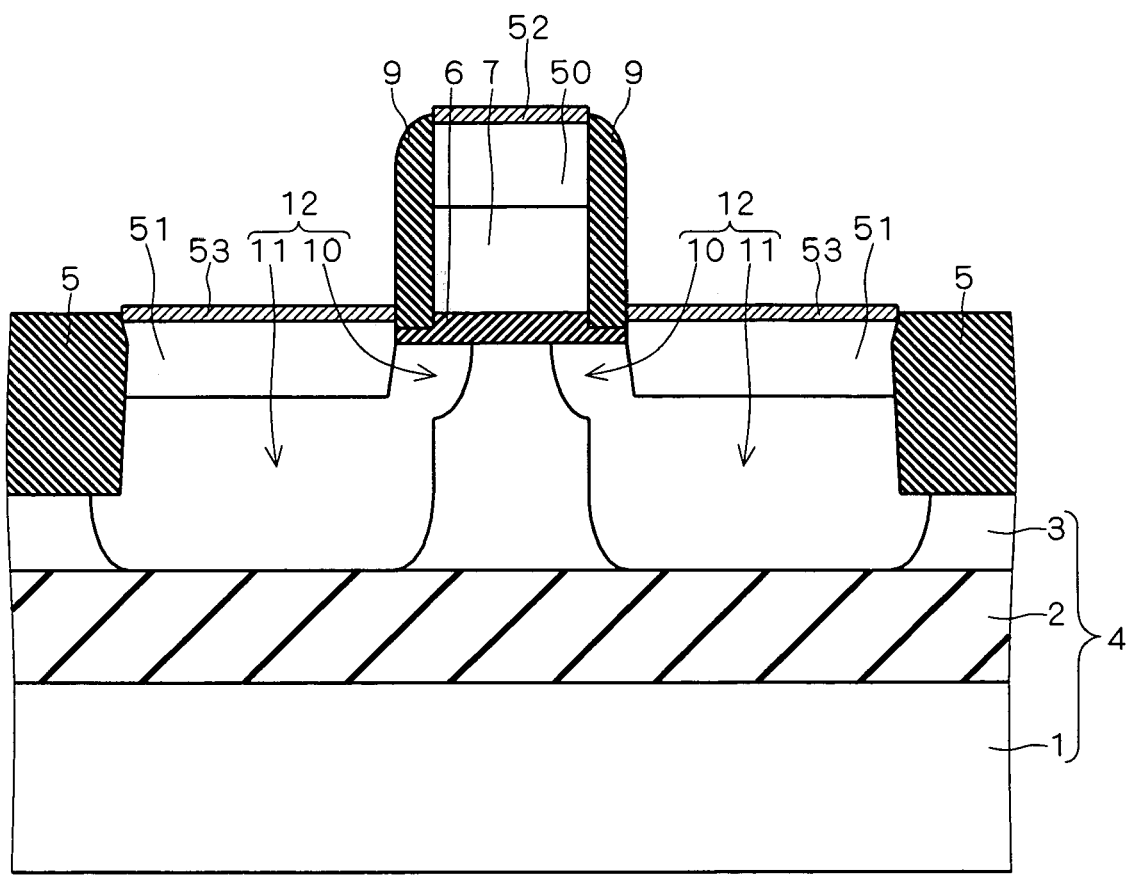

FIGS. 34 and 35 are cross-sectional views showing a sequence of process steps for forming a semiconductor device according to an eighth preferred embodiment of the present invention. Referring to FIG. 34, after the structure shown in FIG. 8 has been obtained, silicon layers 50 and 51 are formed by selective epitaxial growth respectively on the gate electrode 7 and on the source/drain regions 12. Next, n-type impurities are ion-implanted at high concentration into the silicon layers 50 and 51.

Next, referring to FIG. 35, the top surfaces of the silicon layers 50 and 51 are silicidized to form cobalt silicide layers 52 and 53. Since n-type impurities have been implanted into the silicon layers 50 and 51, the contact resistance between the silicon layers 50 and 51 and the cobalt silicide layers 52 and 53 is reduced.

In this way, according to the semiconductor device and manufacturing method of the eighth preferred embodiment, the cobalt silicide layers 53 are formed on the silicon layers 51 that are formed on the source/drain regions 12. This enlarges the distances between the cobalt silicide layers 53 and the channel formation region, which reduces the junction leakage current flowing between them.

Ninth Preferred Embodiment.

Figure 36:
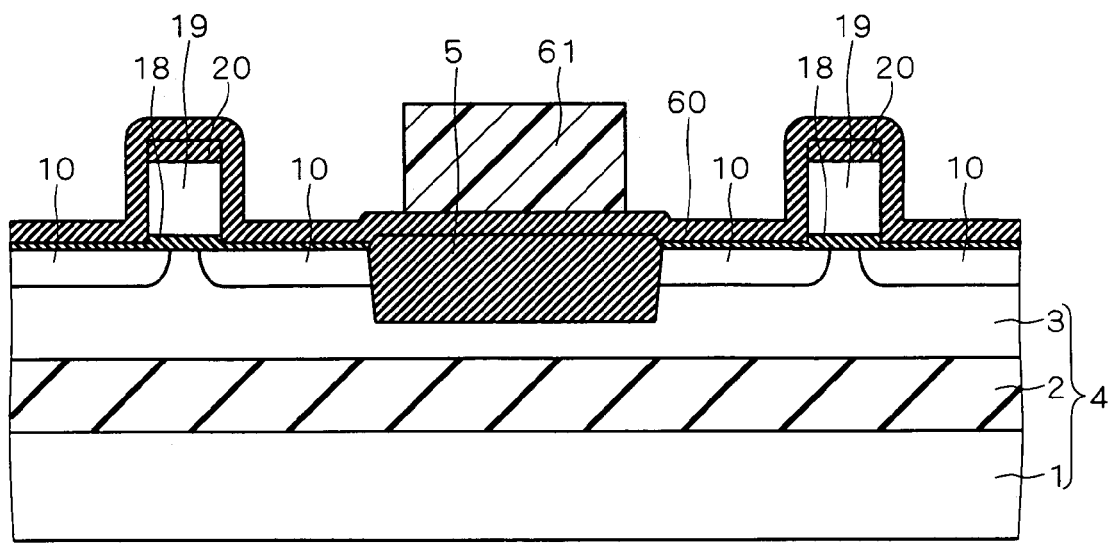
FIGS. 36 to 38 are cross-sectional views showing a sequence of process steps for manufacturing a semiconductor device of a ninth preferred embodiment of the present invention.
Figure 37:
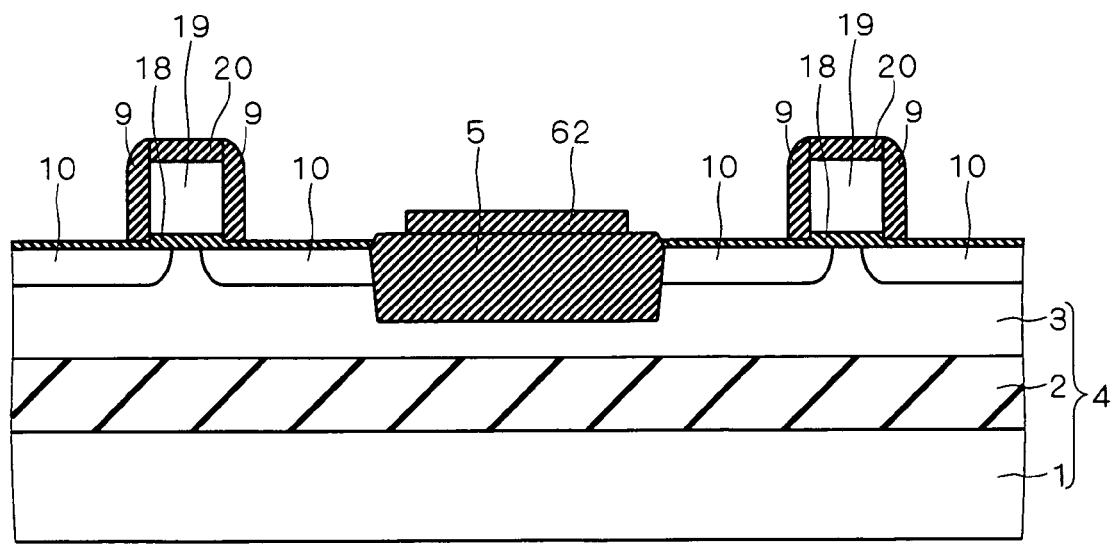
Figure 38:
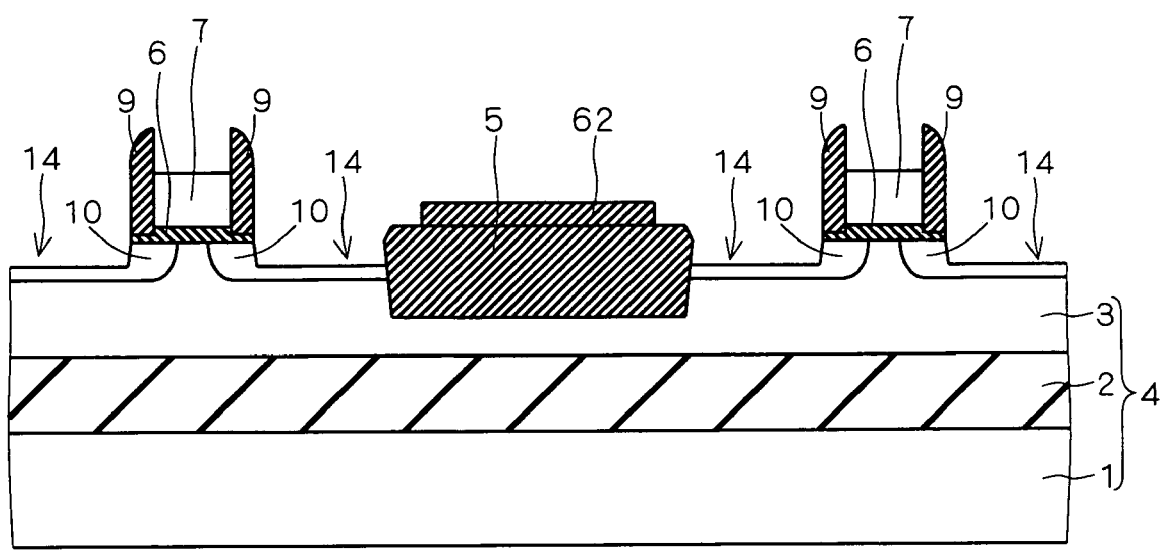

FIGS. 36 to 38 are cross-sectional views showing a sequence of process steps for manufacturing a semiconductor device according to a ninth preferred embodiment of the present invention. Referring to FIG. 36, after the structure shown in FIG. 4 has been obtained, a silicon nitride film 60 is formed by CVD all over the surface. Next, by photolithography, photoresist 61 is formed on the silicon nitride film 60 in the part located on the element isolation insulating film 5.

Next, referring to FIG. 37, using the photoresist 61 as an etching mask, the silicon nitride film 60 is etched back by anisotropic dry-etching. The sidewalls 9 are thus formed, and also the silicon nitride film 62 is formed on the element isolation insulating film 5. Next, the photoresist 61 is removed.

Next, referring to FIG. 38, the silicon oxide films 20 and the portions of the silicon oxide film 18 that are not covered by the sidewalls 9 and polysilicon films 19 are removed. Next, the portions of the silicon layer 3 that are not covered by the gate insulating films 6 and element isolation insulating film 5 are etched to form recesses 14. The upper portions of the polysilicon films 19 are also etched to form gate electrode 7. Then the process step of FIG. 8 and subsequent steps are performed in order.

As shown above, according to the semiconductor device and manufacturing method of the ninth preferred embodiment, the structure in which the silicon nitride film 62 is formed on the element isolation insulating film 5 and the recessed source/drain structure are combined to effectively suppress reduction of isolation breakdown voltage. That is to say, in the step of forming the sidewalls 9, the silicon nitride film 62 is also formed on the element isolation insulating film 5, so that the element isolation insulating film 5 is substantially thickened. This more effectively suppresses the phenomenon that, during the ion implantation process for formation of the impurity-introduced regions 11, n-type impurities pass through the element isolation insulating film 5 to enter the silicon layer 3.

While FIG. 37 shows a narrow silicon nitride film 62 that is formed within the top surface of the element isolation insulating film 5, a wider silicon nitride film 62 may be formed with its edge portions formed on the silicon oxide film 18. In this case, the area of the impurity-introduced regions 11 is reduced, which reduces the junction capacitance.

Tenth Preferred Embodiment

FIG. 39 is a cross-sectional view showing the structure of a semiconductor device according to a tenth preferred embodiment of the present invention. Based on the semiconductor device of the first preferred embodiment shown in FIG. 1, the semiconductor device of the tenth preferred embodiment further includes n-type impurity-introduced regions 70 formed in the top surface of the silicon layer 3. Namely, the source/drain regions 12 include the n-type impurity-introduced regions 10, 11 and 70.

Figure 41:
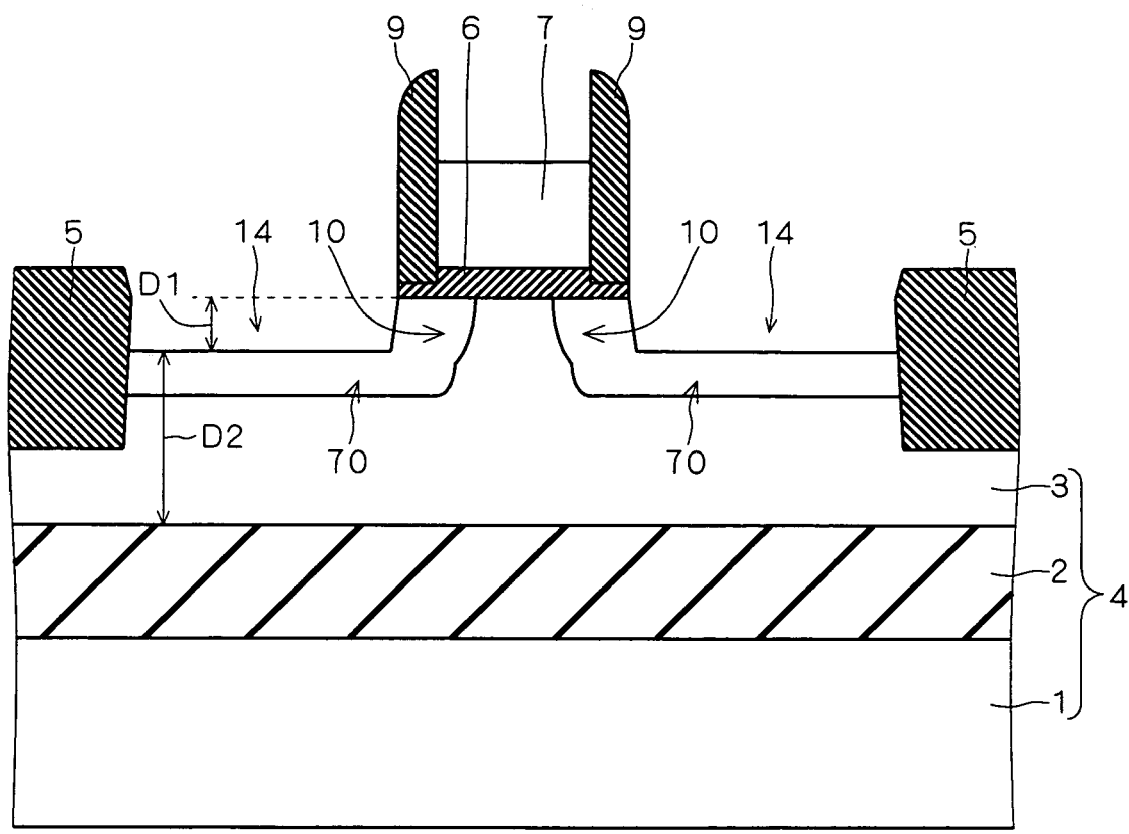

FIGS. 40 and 41 are cross-sectional views showing a first sequence of process steps for manufacturing the semiconductor device of the tenth preferred embodiment. Following the same process steps as employed in the first preferred embodiment, the structure shown in FIG. 6 is obtained first.

Referring to FIG. 40, n-type impurities such as arsenic are thereafter ion-implanted into the top surface of the silicon layer 3, at an energy level ranging approximately from 1 to 30 keV, and at a concentration level of about $1\times10^{15}/cm^2$, whereby the n-type impurity-introduced regions 70 are provided.

Next, referring to FIG. 41, anisotropic dry-etching is performed under a condition in which silicon and polysilicon are readily etched whereas silicon oxide and silicon nitride films are less likely to be etched. Thus the portions of the silicon layer 3 that are not covered by the gate insulating film 6 and the element isolation insulating films 5 are etched by the film thickness D1, so as to form the recesses 14. The top portion of the polysilicon film 19 is also etched, thereby forming the gate electrode 7. Then the process step of FIG. 8 and subsequent steps are performed in order, to complete the semiconductor device of the tenth preferred embodiment.

Figure 42:
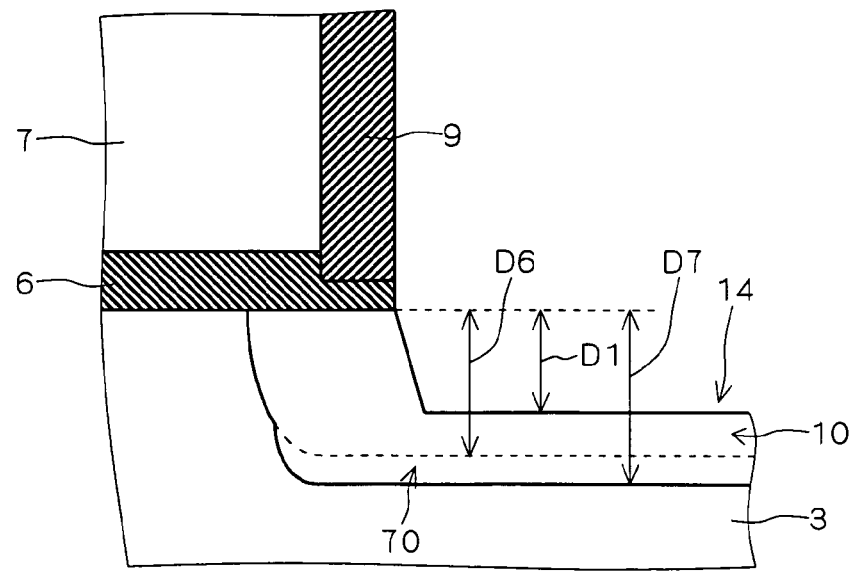
FIG. 42 is a cross-sectional view showing the tenth preferred embodiment of the present invention, where a portion in the vicinity of a recess in the structure of FIG. 41 is shown in an enlarged manner.

FIG. 42 is a cross-sectional view showing, in an enlarged manner, a portion in the vicinity of the recess 14 in the structure of FIG. 41. A depth D7 from the top surface of the silicon layer 3 to the bottom surface of the impurity-introduced region 70 is greater than the depth D6 from the top surface of the silicon layer 3 to the bottom surface of the impurity-introduced region 10. Further, the depth (thickness D1) from the top surface of the silicon layer 3 to the bottom surface of the recess 14 is smaller than the thickness D7. Referring to the process step of FIG. 41, etching is so controlled that the thickness D1 is less than the depth D7. Referring to FIG. 42, the thickness D1 is shown to be smaller than the depth D6, whereas in the tenth preferred embodiment, the thickness D1 may alternatively be equal to or greater than the depth D6.

Figure 43:
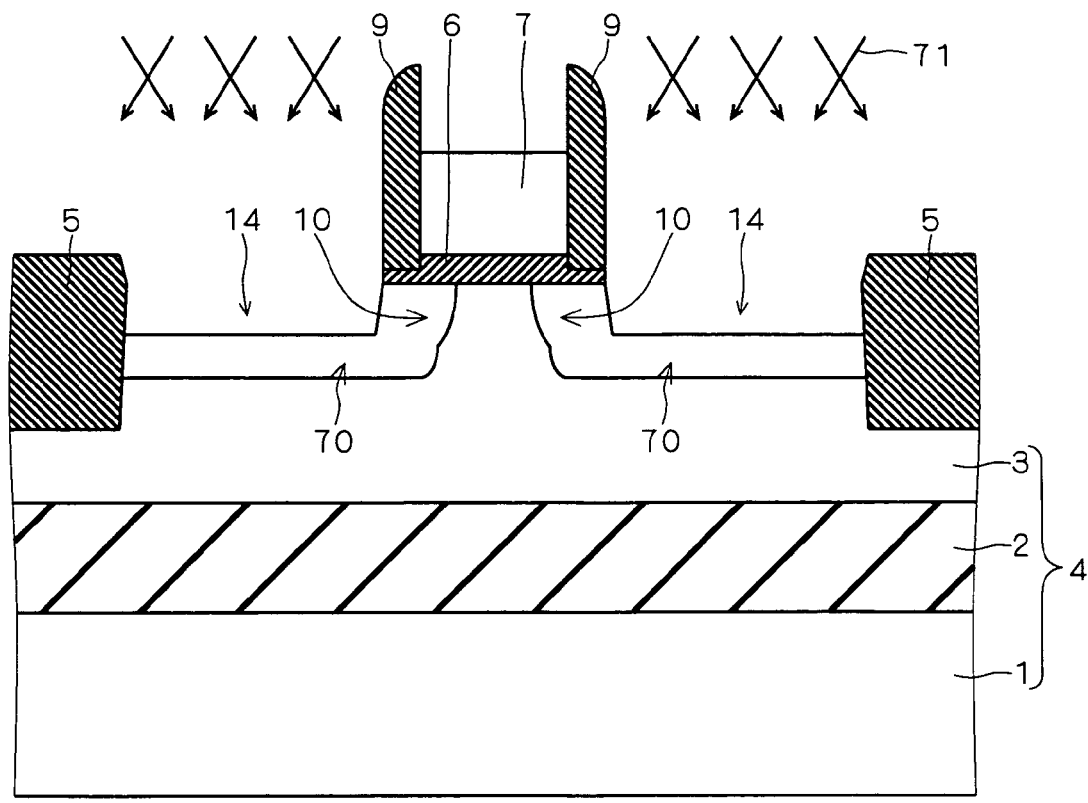

FIGS. 43 and 44 are cross-sectional views showing a second sequence of process steps for manufacturing the semiconductor device of the tenth preferred embodiment. Following the same process steps as employed in the first preferred embodiment, the structure shown in FIG. 7 is obtained first.

Referring to FIG. 43, n-type impurities 71 such as arsenic are thereafter ion-implanted into the silicon layer 3, at an energy level ranging approximately from 1 to 30 keV, at a concentration level of about $1 \times 10^{15}/cm^2$, and in a direction at an inclination of about 30 degrees from the normal to the top surface of the SOI substrate 4. The impurity-introduced regions 70 are thus provided.

Subsequently, the same process step as the one shown in FIG. 8 is followed. That is, n-type impurities are ion-implanted into the top surface of the silicon layer 3, whereby the impurity-introduced regions 11 are provided. The next step is silicidation of each top surface of the gate electrode 7 and the source/drain regions 12, to complete the semiconductor device of the tenth preferred embodiment.

As described, according to the semiconductor device and its manufacturing method of the tenth preferred embodiment, the existence of the impurity-introduced regions 70 leads to further suppression of the increase in parasitic resistance of the source/drain regions 12 as a result of formation of the recesses 14.

In the process step of FIG. 41, etching is so controlled that the thickness D1 should be less than the depth D7, not less than the depth D6, allowing the recesses 14 to reach the greater depth than the one allowed in the first preferred embodiment. The tenth preferred embodiment thus requires lower energy level in ion implantation for forming the impurity-introduced regions 11 (FIGS. 8 and 44) than the one required by the first preferred embodiment. As compared with the first preferred embodiment, the tenth preferred embodiment is thereby allowed to more reliably avoid implantation of impurities into the p-type silicon layer 3 defined between the bottom surfaces of the element isolation insulating films 5 and the top surface of the BOX layer 2. As a result, reduction in isolation breakdown voltage can be prevented with higher reliability.

Ion implantation for forming the impurity-introduced regions 70 causes the n-type impurities to be implanted further into the gate electrode 7, thereby affording a greater degree of suppression of gate depletion. As a result, current driving capability can be improved to a higher level.

In the first preferred embodiment, the increase in parasitic resistance of the source/drain regions 12 may be suppressed by an alternative way other than provision of the impurity-introduced regions 70. The greater value of the depth D6 from the top surface of the silicon layer 3 to the bottom surface of the impurity-introduced region 10 may result in such suppression. However, the value of the depth D6 predominantly affects short channel effect. That is, the greater the depth D6, the greater the influence exerted by the short channel effect. The greater value of the D6 is thus undesirable in the first preferred embodiment. In contrast, the semiconductor device and its manufacturing method of the tenth preferred embodiment require no increase in value of the depth D6, thereby preventing growth of the influence of the short channel effect.

The tenth preferred embodiment has been described as an exemplary application to the first preferred embodiment. The tenth preferred embodiment may alternatively be applied to all the other preferred embodiments of the present invention.

Eleventh Preferred Embodiment

The tenth preferred embodiment is intended to form only an NMOS transistor, whereas in a manufacturing method of an eleventh preferred embodiment of the present invention, the tenth preferred embodiment will be employed to form a CMOS transistor.

FIGS. 45 to 51 are cross-sectional views showing a first sequence of process steps for manufacturing a semiconductor device of the eleventh preferred embodiment. Following the same process steps as employed in the fourth preferred embodiment, the structure shown in FIG. 24 is obtained first.

Figure 45:
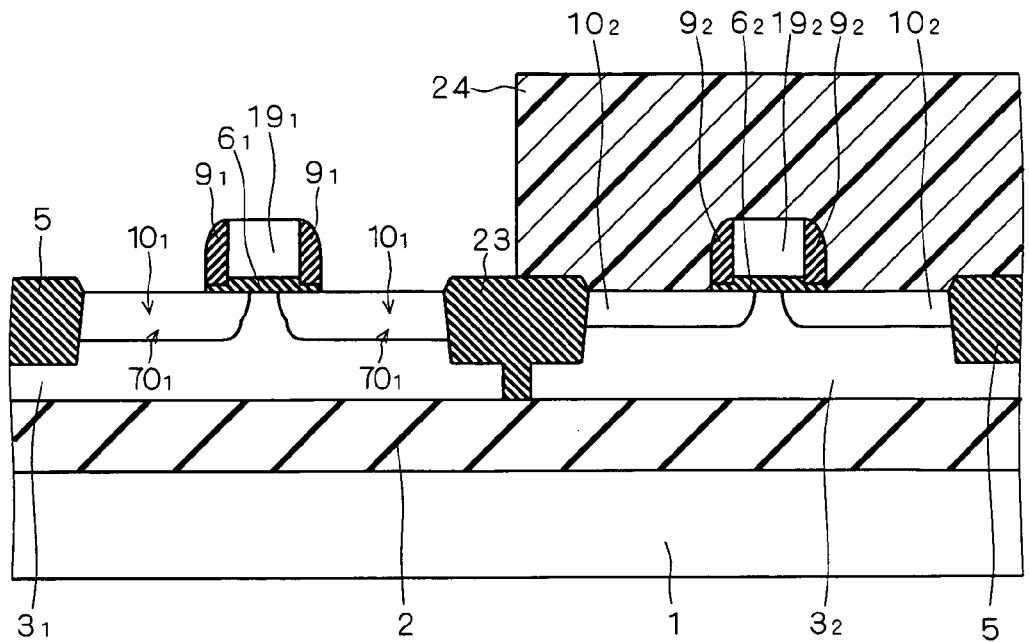
FIGS. 45 to 51 are cross-sectional views showing a first sequence of process steps for manufacturing a semiconductor device according to an eleventh preferred embodiment of the present invention.

Next, referring to FIG. 45, n-type impurities are implanted into the top surface of the silicon layer $3_1$ using the photoresist 24 as an implant mask, to form impurity-introduced regions $70_1$.

Figure 46:
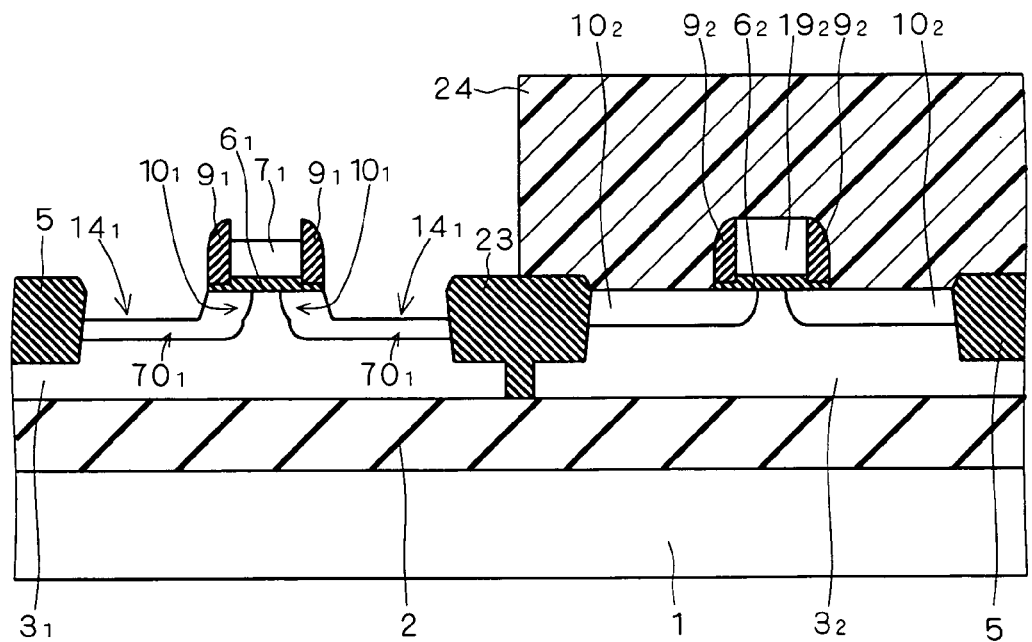

Referring to FIG. 46, using the photoresist 24 as an etching mask, anisotropic dry-etching is thereafter performed under a condition in which silicon and polysilicon are readily etched whereas silicon oxide and silicon nitride films are less likely to be etched. Thus the portions of the silicon layer $3_1$ that are not covered by the photoresist 24, by the gate insulating film $6_1$ and by the element isolation insulating films 5 and 23 are etched, so as to form the recesses $14_1$. The top portion of the polysilicon film $19_1$ is also etched, thereby forming the gate electrode $7_1$.

Figure 47:
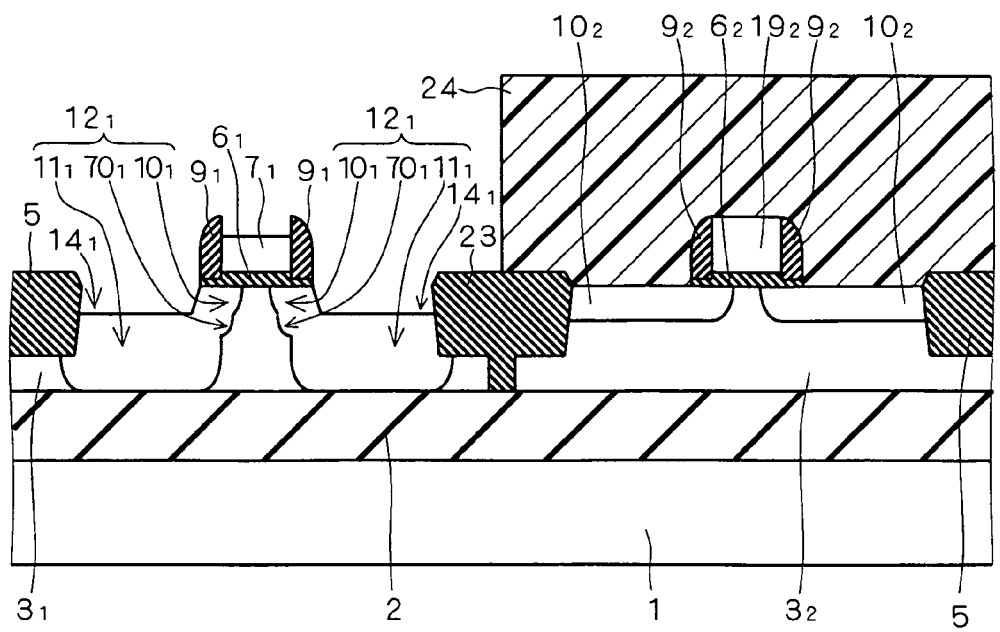

Subsequently, referring to FIG. 47, n-type impurities are ion-implanted into the top surface of the silicon layer $3_1$ using the photoresist 24 as an implant mask, whereby the impurity-introduced regions $11_1$ are provided. These n-type impurities are also implanted into the gate electrode $7_1$.

Figure 48:
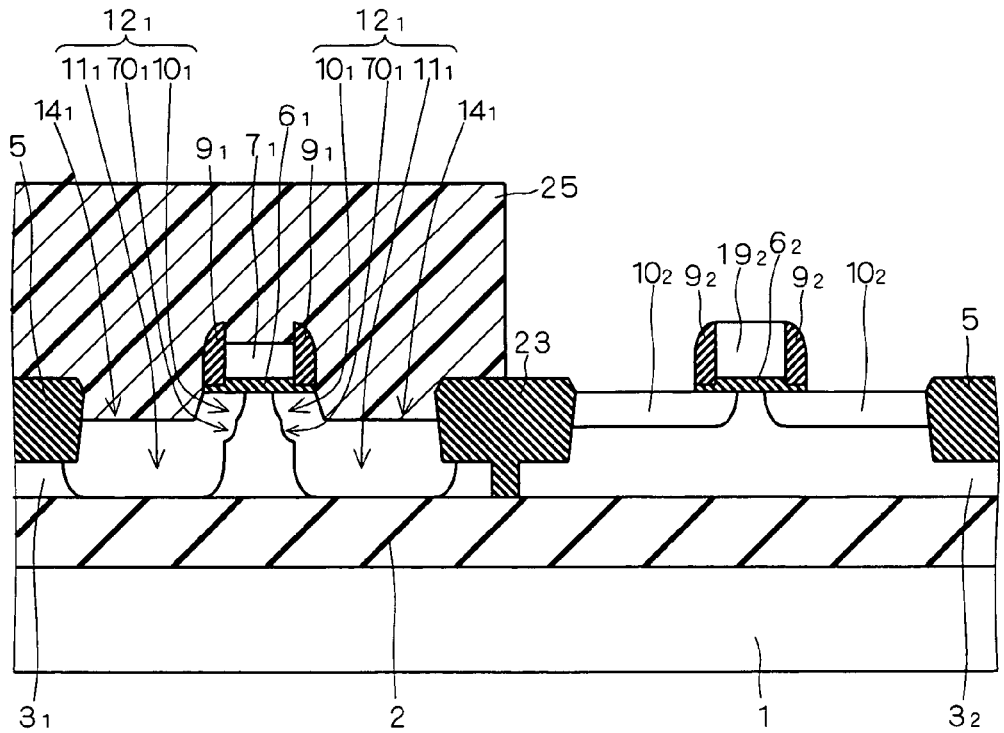

Referring to FIG. 48, the next step is removal of the photoresist 24, followed by photolithography to form the photoresist 25 for covering the area where the NMOS transistor is to be formed.

Figure 49:
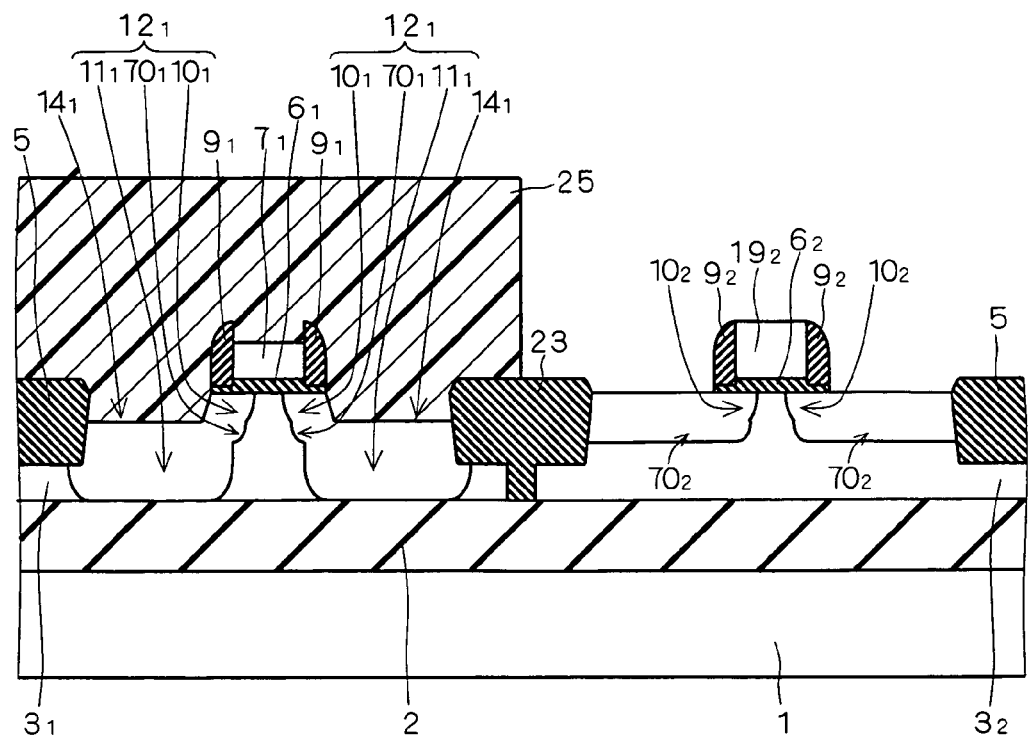

Next, referring to FIG. 49, p-type impurities are ion-implanted into the top surface of the silicon layer $3_2$ using the photoresist 25 as an implant mask, to form impurity-introduced regions $70_2$.

Figure 50:
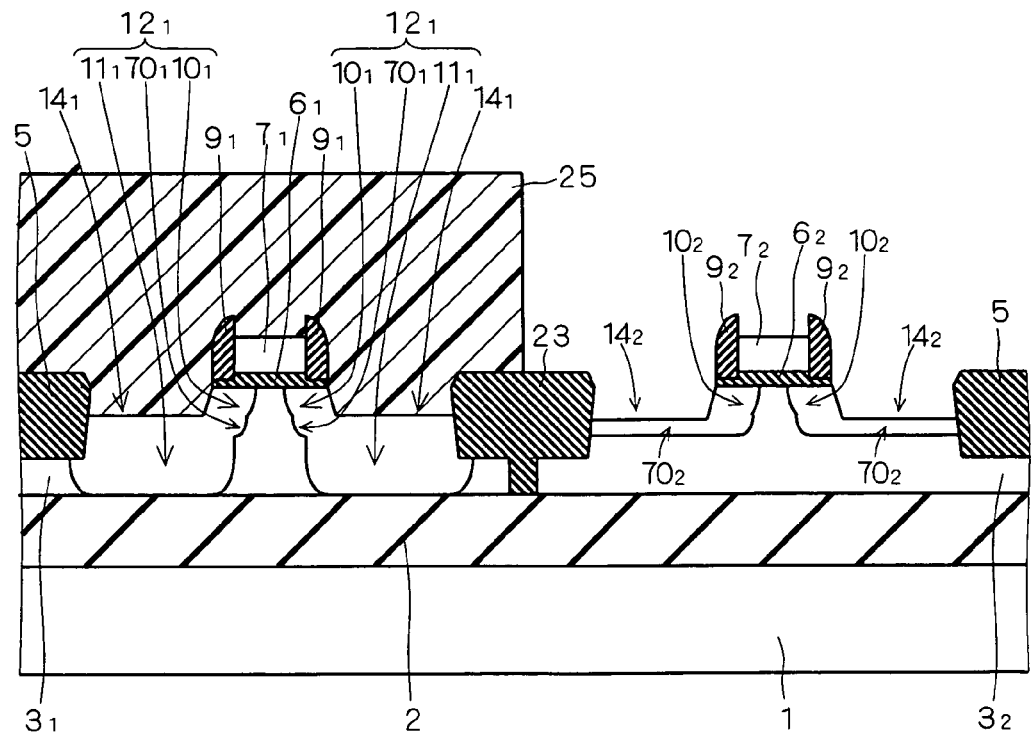

Referring to FIG. 50, using the photoresist 25 as an etching mask, anisotropic dry-etching is thereafter performed under a condition in which silicon and polysilicon are readily etched whereas silicon oxide and silicon nitride films are less likely to be etched. Thus the portions of the silicon layer $3_2$ that are not covered by the photoresist 25, by the gate insulating film $6_2$ and by the element isolation insulating films 5 and 23 are etched, so as to form the recesses $14_2$. The top portion of the polysilicon film $19_2$ is also etched, thereby forming the gate electrode $7_2$.

Figure 51:
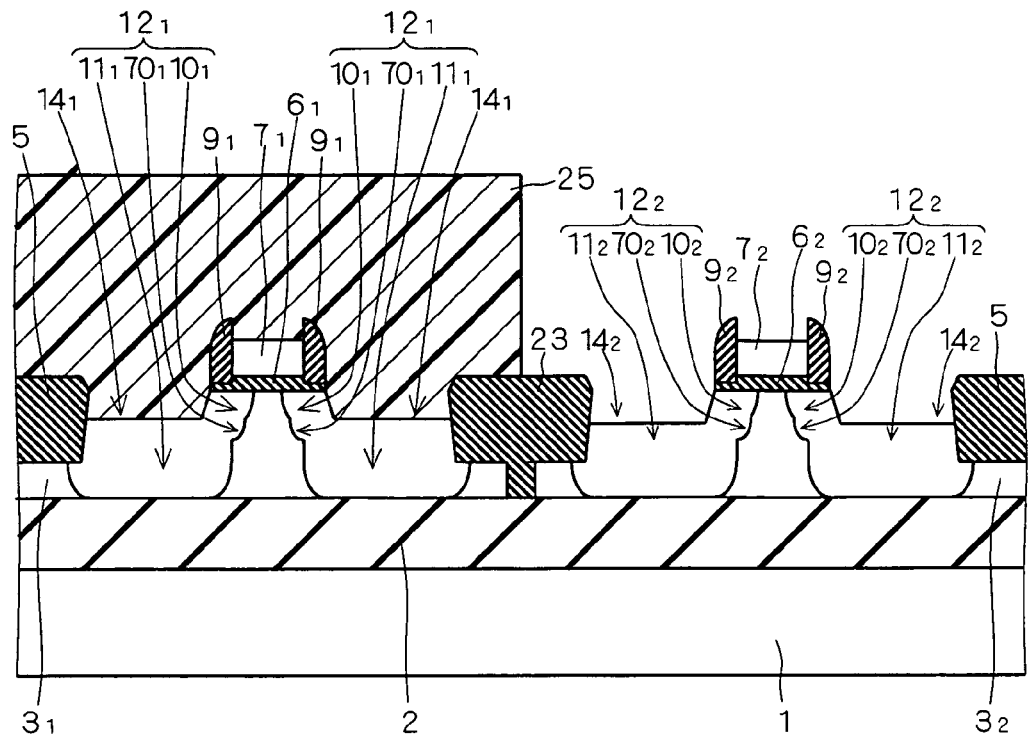

Subsequently, referring to FIG. 51, p-type impurities are ion-implanted into the top surface of the silicon layer $3_2$ using the photoresist 25 as an implant mask, whereby the impurity-introduced regions $11_2$ are provided. These p-type impurities are also implanted into the gate electrode $7_2$.

The photoresist 25 is thereafter removed, followed by silicidation of each top surface of the gate electrodes $7_1$ and $7_2$, and of the source/drain regions $12_1$ and $12_2$, to complete the semiconductor device of the eleventh preferred embodiment.

FIGS. 52 to 56 are cross-sectional views showing a second sequence of process steps for manufacturing the semiconductor device of the eleventh preferred embodiment. Following the same process steps as employed in the fourth preferred embodiment, the structure shown in FIG. 23 is obtained first.

Figure 52:
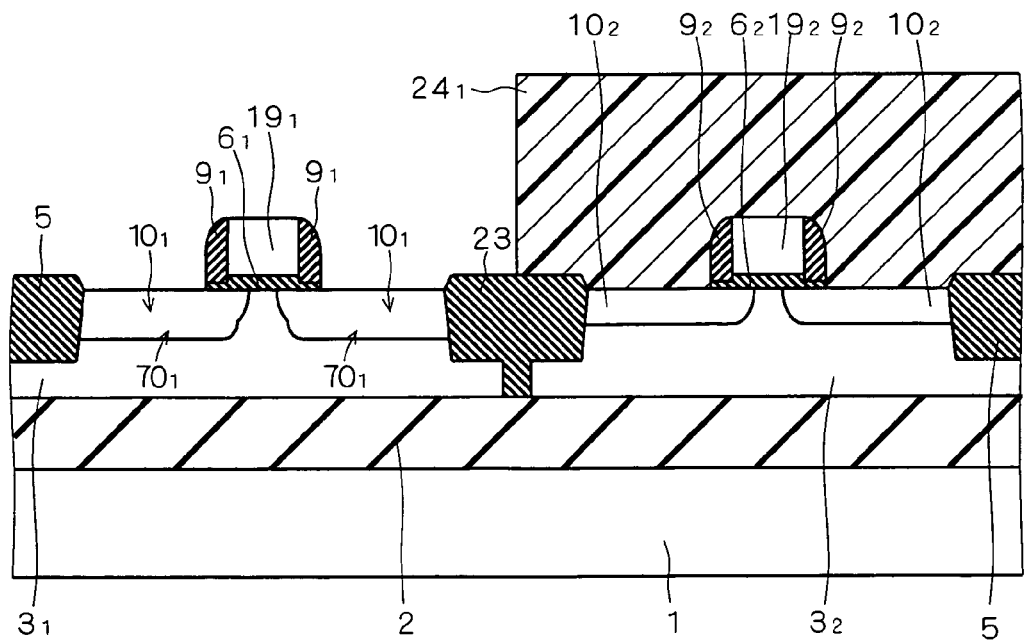
FIGS. 52 to 56 are cross-sectional views showing a second sequence of process steps for manufacturing the semiconductor device of the eleventh preferred embodiment of the present invention.

Next, referring to FIG. 52, photoresist $24_1$ is provided by photolithography to cover the area where the PMOS transistor is to be formed. N-type impurities are thereafter ion-implanted into the top surface of the silicon layer $3_1$ using the photoresist $24_1$ as an implant mask, thereby forming the impurity-introduced regions $70_1$.

Figure 53:
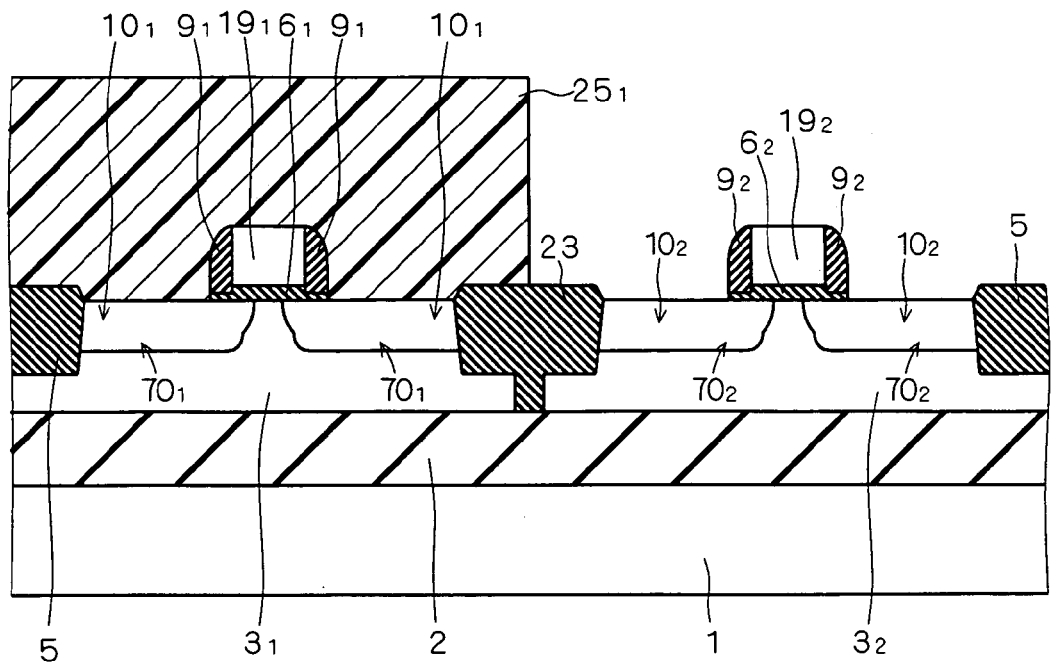

Referring to FIG. 53, the next step is removal of the photoresist $24_1$, followed by photolithography to form photoresist $25_1$ for covering the area where the NMOS transistor is to be formed. P-type impurities are thereafter ion-implanted into the top surface of the silicon layer $3_2$ using the photoresist $25_1$ as an implant mask, to form the impurity-introduced regions $70_2$.

Figure 54:
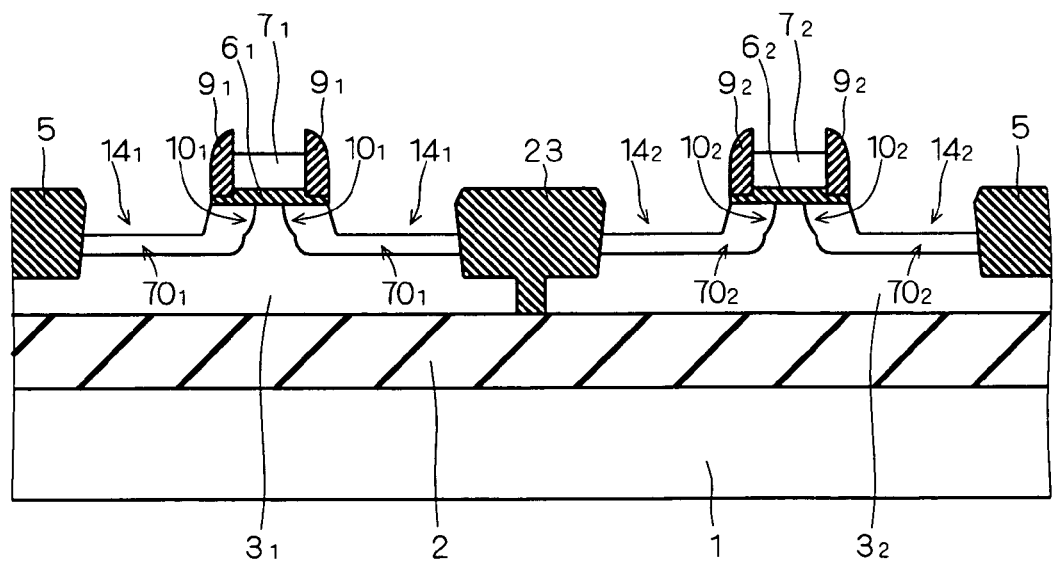

Next, referring to FIG. 54, the photoresist $25_1$ is removed. Subsequently, anisotropic dry-etching is performed under a condition in which silicon and polysilicon are readily etched whereas silicon oxide and silicon nitride films are less likely to be etched. As a result, the portions of the silicon layers $3_1$ and $3_2$ are etched that are not covered by the gate insulating films $6_1$ and $6_2$ and by the element isolation insulating films 5 and 23, so as to form the recesses $14_1$ and $14_2$. The top portions of the polysilicon films $19_1$ and $19_2$ are also etched, thereby respectively forming the gate electrodes $7_1$ and $7_2$.

Figure 55:
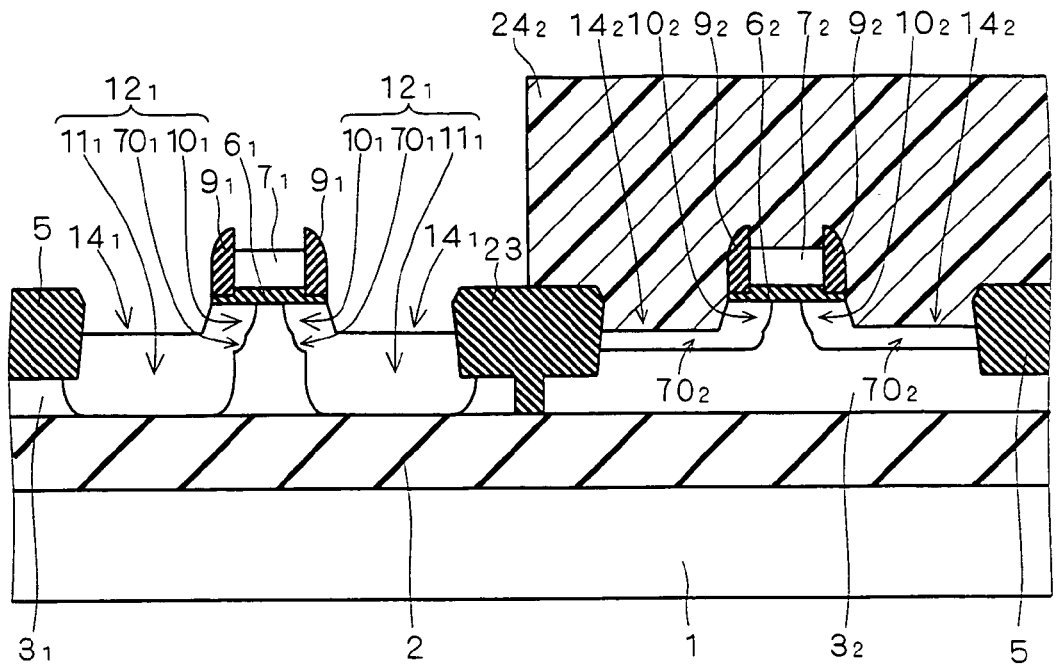

Referring to FIG. 55, the next step is photolithography to form photoresist $24_2$ for covering the area where the PMOS transistor is to be formed. Thereafter n-type impurities are ion-implanted into the top surface of the silicon layer $3_1$ using the photoresist $24_2$ as an implant mask, thereby forming the impurity-introduced regions $11_1$.

Figure 56:
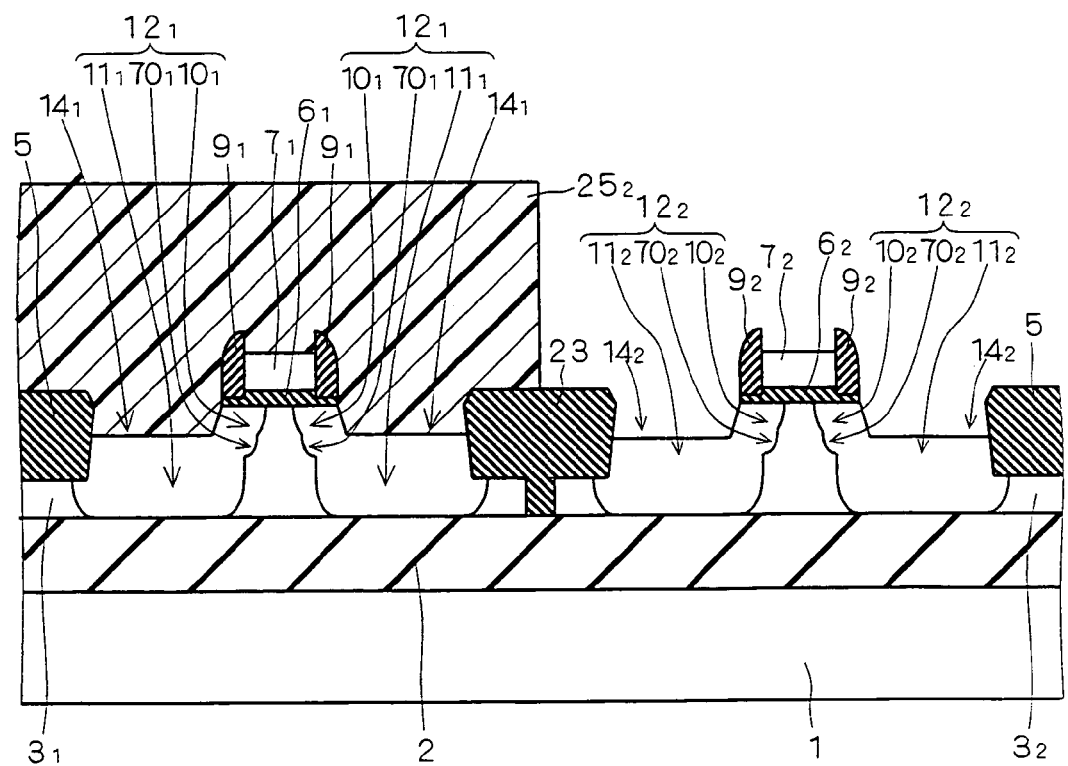

Referring to FIG. 56, the next step is removal of the photoresist $24_2$, followed by photolithography to form photoresist $25_2$ for covering the area where the NMOS transistor is to be formed. P-type impurities are thereafter ion-implanted into the top surface of the silicon layer $3_2$ using the photoresist $25_2$ as an implant mask, to form the impurity-introduced regions $11_2$.

The photoresist $25_2$ is thereafter removed, followed by silicidation of each top surface of the gate electrodes $7_1$ and $7_2$ and of the source/drain regions $12_1$ and $12_2$, to complete the semiconductor device of the eleventh preferred embodiment.

The first sequence of the eleventh preferred embodiment shown in FIGS. 45 to 51 requires only one photolithography step, whereas the second sequence shown in FIGS. 52 to 56 requires four photolithography steps. That is, the first sequence requires smaller number of process steps as compared with the second sequence.

On the other hand, the second sequence of the eleventh preferred embodiment allows the recesses $14_1$ and $14_2$ to be simultaneously formed in one etching step. That is, as compared with the first sequence which requires two etching steps to respectively form the recesses $14_1$ and $14_2$, the quantity of waste generated by etching in an etching chamber can be lowered, whereby improvement in yield is realized. As compared with the photoresists 24 and 25 which are subjected to the impact of both etching and ion implantation, further, the photoresists $24_2$ and $25_2$ can easily be removed by ashing as they are subjected to the impact only of ion implantation.

Twelfth Preferred Embodiment

FIG. 57 is a cross-sectional view showing a process step for manufacturing a semiconductor device according to a twelfth preferred embodiment of the present invention. Following the same process steps as employed in the first preferred embodiment, the structure shown in FIG. 6 is obtained first.

Next, silicon ions 80 are ion-implanted into the silicon layer 3 in the regions where the recesses 14 are to be formed, at a concentration level on the order of $10^{15}/cm^2$. The silicon ions 80 may be replaced by argon ions or germanium ions. These regions of the silicon layer 3 are thus changed into amorphous silicon regions 81. The amorphous silicon regions 81 are the result of ion implantation, and therefore, the bottom surfaces of the amorphous silicon regions 81 reach an equal depth from the top surface of the silicon layer 3 in the plane of a wafer. Thereafter, the process step of FIG. 7 and subsequent steps are performed in order.

As described, according to the manufacturing method of the twelfth preferred embodiment, the silicon layer 3 is changed to an amorphous state in the regions where the recesses 14 are to be formed, and thereafter, the amorphous silicon regions 81 are etched to form the recesses 14. The amorphous silicon regions 81 are sufficiently higher in etching rate than the other regions of the silicon layer 3 (namely, single-crystalline silicon regions). That is, the difference in etching rate between the amorphous silicon regions 81 and the single-crystalline silicon regions allows equal depth of the recesses 14 in the plane of the wafer.

The twelfth preferred embodiment has been described as an exemplary application to the first preferred embodiment. The twelfth preferred embodiment may alternatively be applied to all the other preferred embodiments of the present invention.

While the invention has been described in detail, the foregoing description is in all aspects illustrative and not restrictive. It is understood that numerous other modifications and variations can be devised without departing from the scope of the present invention.

What is claimed is:

1. A semiconductor device comprising:
   an SOI substrate having a semiconductor substrate, an insulating layer, and a semiconductor layer of a first conductivity type that are stacked in this order;
   element isolation insulating films formed partially in a main surface of said semiconductor layer, with portions of said semiconductor layer interposed between said insulating layer and bottom surfaces of said element isolation insulating films;
   a gate structure formed partially on said main surface of said semiconductor layer in an element formation region defined by said element isolation insulating films;
   a pair of recesses formed in said element formation region, said recesses being formed in said main surface of said semiconductor layer in portions that are not covered by said gate structure, with a channel formation region under said gate structure interposed between said pair of recesses; and source/drain regions formed in bottom surfaces of said recesses and having a second conductivity type that is different from said first conductivity type, said source/drain regions forming a pair, with said channel formation region interposed therebetween, and having bottom surfaces or depletion layers that reach said insulating layer, wherein the part of said main surface of said semiconductor layer on which said gate structure resides forms an angle larger than 90° with a corresponding side surface of each said recess.

2. A semiconductor device comprising:

an SOI substrate having a semiconductor substrate, an insulating layer, and a semiconductor layer of a first conductivity type that are stacked in this order;

element isolation insulating films formed partially in a main surface of said semiconductor layer, with portions of said semiconductor layer interposed between said insulating layer and bottom surfaces of said element isolation insulating films;

a gate structure formed partially on said main surface of said semiconductor layer in an element formation region defined by said element isolation insulating films;

a pair of recesses formed in said element formation region, said recesses being formed in said main surface of said semiconductor layer in portions that are not covered by said gate structure, with a channel formation region under said gate structure interposed between said pair of recesses; and source/drain regions formed in bottom surfaces of said recesses and having a second conductivity type that is different from said first conductivity type, said source/drain regions forming a pair, with said channel formation region interposed therebetween, and having bottom surfaces or depletion layers that reach said insulating layer, wherein said source/drain regions comprise:
first impurity-introduced regions having a relatively low concentration and formed in said main surface of said semiconductor layer; and
second impurity-introduced regions having a relatively high concentration and formed deeper than said first impurity-introduced regions, wherein a depth from said main surface of said semiconductor layer to bottom surface of each said recess is smaller than a depth from said main surface of said semiconductor layer to a bottom surface of each said first impurity-introduced region.

3. The semiconductor device according to claim 2, wherein said source/drain regions further comprise third impurity-introduced regions formed in said main surface of said semiconductor layer, reaching a depth shallower than a depth of said second impurity-introduced regions.

4. A semiconductor device comprising:

an SOI substrate having a semiconductor substrate, an insulating layer, and a semiconductor layer of a first conductivity type that are stacked in this order;

element isolation insulating films formed partially in a main surface of said semiconductor layer, with portions of said semiconductor layer interposed between said insulating layer and bottom surfaces of said element isolation insulating films;

a gate structure formed partially on said main surface of said semiconductor layer in an element formation region defined by said element isolation insulating films;

a pair of recesses formed in said element formation region, said recesses being formed in said main surface of said semiconductor layer in portions that are not covered by said gate structure, with a channel formation region under said gate structure interposed between said pair of recesses; and source/drain regions formed in bottom surfaces of said recesses and having a second conductivity type that is different from said first conductivity type, said source/drain regions forming a pair, with said channel formation region interposed therebetween, and having bottom surfaces or depletion layers that reach said insulating layer, wherein said source/drain regions comprise:
first impurity-introduced regions having a relatively low concentration and formed in said main surface of said semiconductor layer;
second impurity-introduced regions having a relatively high concentration and formed deeper than said first impurity-introduced regions; and
third impurity-introduced regions formed in said main surface of said semiconductor layer, wherein a depth from said main surface of said semiconductor layer to bottom surfaces of said third impurity-introduced regions is greater than a depth from said main surface of said semiconductor layer to bottom surfaces of said first impurity-introduced regions, and wherein a depth from said main surface of said semiconductor layer to said bottom surfaces of said recesses is smaller than a depth from said main surface of said semiconductor layer to said bottom surfaces of said third impurity-introduced regions.

5. A semiconductor device comprising:

an SOI substrate having a semiconductor substrate, an insulating layer, and a semiconductor layer of a first conductivity type that are stacked in this order;

element isolation insulating films formed partially in a main surface of said semiconductor layer, with portions of said semiconductor layer interposed between said insulating layer and bottom surfaces of said element isolation insulating films;

a gate structure formed partially on said main surface of said semiconductor layer in an element formation region defined by said element isolation insulating films;

a pair of recesses formed in said element formation region, said recesses being formed in said main surface of said semiconductor layer in portions that are not covered by said gate structure, with a channel formation region under said gate structure interposed between said pair of recesses; and source/drain regions formed in bottom surfaces of said recesses and having a second conductivity type that is different from said first conductivity type, said source/drain regions forming a pair, with said channel formation region interposed therebetween, and having bottom surfaces or depletion layers that reach said insulating layer, wherein said gate structure comprises:
a gate insulating film formed on said main surface of said semiconductor layer;
a gate electrode formed on said gate insulating film; and first sidewalls formed on sides of said gate electrode;
and wherein said semiconductor device further comprises:
second sidewalls formed on said bottom surfaces of said recesses and in contact with said first sidewalls; and
metal-semiconductor compound layers formed on said source/drain regions in portions that are not covered by said second sidewalls.

6. The semiconductor device according to claim 5, further comprising third sidewalls formed on said bottom surfaces of said recesses and being in contact with said element isolation insulating films,
wherein said metal-semiconductor compound layers are formed on said source/drain regions in portions that are not covered by said second and third sidewalls.

* * * * *